United States Patent
Qiu et al.

(10) Patent No.: US 10,526,535 B2
(45) Date of Patent: Jan. 7, 2020

(54) QUANTUM DOTS WITH MIXED AMINE AND THIOL LIGANDS

(71) Applicant: 3M INNOVATIVE PROPERTIES COMPANY, St. Paul, MN (US)

(72) Inventors: Zai-Ming Qiu, Woodbury, MN (US); Joseph M. Pieper, Atlanta, GA (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/302,735

(22) PCT Filed: May 11, 2017

(86) PCT No.: PCT/US2017/032058
§ 371 (c)(1),
(2) Date: Nov. 19, 2018

(87) PCT Pub. No.: WO2017/200824
PCT Pub. Date: Nov. 23, 2017

(65) Prior Publication Data
US 2019/0292447 A1    Sep. 26, 2019

Related U.S. Application Data

(60) Provisional application No. 62/339,169, filed on May 20, 2016.

(51) Int. Cl.
*C09K 11/02* (2006.01)
*C09K 11/88* (2006.01)
(Continued)

(52) U.S. Cl.
CPC .......... *C09K 11/025* (2013.01); *C09K 11/565* (2013.01); *C09K 11/883* (2013.01); *H01L 33/502* (2013.01)

(58) Field of Classification Search
CPC ...... C08K 3/30; C09K 11/025; C09K 11/565; C09K 11/883
See application file for complete search history.

(56) References Cited

U.S. PATENT DOCUMENTS 3,705,208 A    12/1972  Nakamuta
3,708,296 A    1/1973   Schlesinger
(Continued)

FOREIGN PATENT DOCUMENTS

WO    WO 2010-039897    4/2010
WO    WO 2015-095296    6/2015
(Continued)

OTHER PUBLICATIONS

Alivisatos, "Epitaxial growth of highly luminescent CdSe/CdS Core/Shell nanocrystals with photostability and electronic accessibility," J. Am. Chem. Soc. 1997, vol. 119, No. 30, pp. 7019-7029.
(Continued)

*Primary Examiner* — Daniel P Shook
(74) *Attorney, Agent, or Firm* — Lisa P. Fulton

(57) ABSTRACT

The present disclosure provides a liquid quantum dots composite that includes: a fluorescent semiconductor core/shell nanoparticle (preferably, nanocrystal or quantum dots); a first polyamine ligand and a second polythiol ligand attached to the core/shell nanoparticle outer surface. At least one of the polythiol and polyamine ligands are silicone ligands.

19 Claims, 2 Drawing Sheets

(51) Int. Cl.
  *C09K 11/56* (2006.01)
  *H01L 33/50* (2010.01)

(56) References Cited

U.S. PATENT DOCUMENTS

| | | | |
|---|---|---|---|
| 4,069,055 | A | 1/1978 | Crivello |
| 4,216,288 | A | 8/1980 | Crivello |
| 4,250,311 | A | 2/1981 | Crivello |
| 4,622,412 | A | 11/1986 | Piskoti |
| 4,857,434 | A | 8/1989 | Klinger |
| 5,015,717 | A | 5/1991 | Martin |
| 5,084,586 | A | 1/1992 | Farooq |
| 5,124,417 | A | 6/1992 | Farooq |
| 5,462,835 | A | 10/1995 | Mirle |
| 5,587,433 | A | 12/1996 | Boeckeler |
| 6,777,460 | B2 | 8/2004 | Palazzotto |
| 6,949,206 | B2 | 9/2005 | Whiteford |
| 7,018,713 | B2 | 3/2006 | Padiyath |
| 7,160,613 | B2 | 1/2007 | Bawendi |
| 8,283,412 | B2 | 10/2012 | Liu |
| 9,139,770 | B2 | 9/2015 | Freeman |
| 2007/0221947 | A1* | 9/2007 | Locascio ............ B82Y 30/00 257/103 |
| 2011/0051047 | A1 | 3/2011 | O'Neill |
| 2013/0345458 | A1 | 12/2013 | Freeman |
| 2015/0018254 | A1 | 1/2015 | Araujo |
| 2016/0376498 | A1 | 12/2016 | Qiu |
| 2018/0057658 | A1 | 3/2018 | Qiu |
| 2018/0282617 | A1 | 10/2018 | Qiu |

FOREIGN PATENT DOCUMENTS

| | | |
|---|---|---|
| WO | WO 2015-138174 | 9/2015 |
| WO | WO 2015-153148 | 10/2015 |
| WO | WO 2016-081219 | 5/2016 |
| WO | WO 2016-167927 | 10/2016 |
| WO | WO 2016-168048 | 10/2016 |
| WO | WO 2017-172462 | 10/2017 |

OTHER PUBLICATIONS

Alivisatos, "Semiconductor clusters, nanocrystals, and quantum dots,", JSTOR, 1996, vol. 271, No. 5251, pp. 933-937.

Bawendi, "Synthesis and characterization of nearly monodisperse CdE (E=sulfur, selenium, tellurium) semiconductor nanocrystallites," J.Am. Chem. Soc. 1995, vol. 115, No. 19, pp. 8706-8715.

Crivello, "Photoinitiators for Free Radical Cationic & Anionic Photopolymerization", 1998, John Wiley and Sons, Ed. 2, pp. 275-299.

Dabbousi, "(CdSe)ZnS core-shell quantum dots: Synthesis and characterization of a size series of highly luminescent nanocrystallites", 1997, vol. 101, No. 46, pp. 9463-9475.

Hines, "Sythesis and characterization of strongly luminescing ZnS-Capped CdSe nanocrystals", J. Phys.Chem, 1996, vol. 100, No. 2, pp. 468-471.

Liu,"Enhancing photoluminescence quenching and photoelectric properties of CdSe quantum dots with hole accepting ligands", J. Mater. Chem., 2008, vol. 18, pp. 675-682.

Lubkowska, "Aminoalkyl Functionalized Siloxanes", Polimery, 2014, vol. 59, pp. 763-768.

Sigalat, "Fluorescence enhancement of amine-capped CdSe/ZnS quantum dots by thiol addition", Can. J.Chem, 2011, vol. 89, pp. 359-363.

Zhu, "Sythesis and optical properties of thiol functionalized CdSe/ZnS (core/shell) quantum dots by ligand exchange", Jounal of Nanomaterials, 2014, pp. 01-15.

International Search report for PCT International Application No. PCT/US2017/032058 dated Aug. 2, 2017, 5 pages.

* cited by examiner

QUANTUM DOTS WITH MIXED AMINE AND THIOL LIGANDS

BACKGROUND

Quantum Dot Enhancement Films (QDEF) are used as the light source for LCD displays. Red and green quantum dots are used in QDEF with a blue LED as the light source to give the full spectrum of colors. This has the advantage of improving the color gamut over the typical LCD display and keeping the energy consumption low compared to LED displays.

Quantum dot film articles include quantum dots dispersed in a matrix that is laminated between two barrier layers. The quantum dot articles, which include combinations of green and red quantum dots as fluorescing elements, can enhance color gamut performance when used in display devices such as, for example, liquid crystal displays (LCDs).

Quantum dots are made in the presence of one or more ligands. Once the quantum dots are synthesized, they may be treated or exchanged with additional organic ligand that binds strongly to the exterior surface of the quantum dot. Colloidal quantum dot nanoparticles (preferably, nanocrystals) that are stabilized with the appropriate organic ligands can have significantly improved quantum yields due to passivating surface traps, controlling dispersion stability in solvent or polymer matrix, stabilizing against aggregation and thermal/photo degradation. Therefore, optimizing the organic ligand is important for achieving optimal quantum yield, processability, and thermal/photo lifetime stability in articles, such as QDEF.

SUMMARY

In one aspect, the present disclosure provides a liquid quantum dots composite that includes: a fluorescent semiconductor core/shell nanoparticle (preferably, nanocrystal or quantum dots); a first polyamine ligand and a second polythiol ligand attached to the core/shell nanoparticle outer surface. At least one of the polythiol and polyamine ligands are silicone ligands.

In another aspect, the present disclosure provides a curable coating composition comprising a) the liquid composite quantum dots comprising a fluorescent semiconductor core/shell nanoparticle (preferably, nanocrystal), a first amine-functionalized ligand and a second polythiol ligand attached to the core/shell nanoparticle outer surface, wherein at least one of the ligands is silicone ligand; b) a liquid curable binder system and optionally, c) a curing initiator. Preferably, the liquid curable binder system is cured at the temperature below than 160° C. More preferably, the liquid curable binder system is cured at the temperature below than 120° C. Most preferably, the liquid curable binder system is cured at ambient temperature, for example, fast cured under the irradiation of UV or E-beam at room temperature.

The coating composition comprising the core/shell nanocrystal particles can be used for such as films for optical display application. The fluorescent semiconductor nanoparticles emit a fluorescence signal at a second wavelength of light (e.g. green and red) when excited by a first wavelength of light (e.g. blue) that is shorter than the second wavelength of light.

The present disclosure further provides a quantum dot film article comprising a first barrier layer, a second barrier layer; and a quantum dot layer between the first barrier layer and the second barrier layer, wherein the quantum dot layer comprising the liquid composite comprising core/shell quantum dot nanocrystals and having a first amine-functionalized ligand and a second polythiol ligand attached to the core/shell nanoparticle outer surface and uniformly dispersed in a polymeric matrix having a $T_g$>20° C.

As used herein:

"Alkyl" means a linear or branched, cyclic or acyclic, saturated monovalent hydrocarbon.

"Alkylene" means a linear or branched unsaturated divalent hydrocarbon.

"Alkenyl" means a linear or branched unsaturated hydrocarbon.

"Aryl" means a monovalent aromatic, such as phenyl, naphthyl and the like.

"Arylene" means a polyvalent, aromatic, such as phenylene, naphthalene, and the like.

"Aralkylene" means a group defined above with an aryl group attached to the alkylene, e.g., benzyl, 1-naphthylethyl, and the like.

As used herein, "(hetero)hydrocarbyl" is inclusive of hydrocarbyl alkyl and aryl groups, and heterohydrocarbyl heteroalkyl and heteroaryl groups, the later comprising one or more catenary (in-chain) heteroatoms such as ether or amino groups. Heterohydrocarbyl may optionally contain one or more catenary (in-chain) functional groups including ester, amide, urea, urethane, and carbonate functional groups. Unless otherwise indicated, the non-polymeric (hetero)hydrocarbyl groups typically contain from 1 to 60 carbon atoms. Some examples of such heterohydrocarbyls as used herein include, but are not limited to, methoxy, ethoxy, propoxy, 4-diphenylaminobutyl, 2-(2'-phenoxyethoxy)ethyl, 3,6-dioxaheptyl, 3,6-dioxahexyl-6-phenyl, in addition to those described for "alkyl", "heteroalkyl", and "aryl" supra.

The term "composite particle" as used herein refers to a nanoparticle, which is typically in the form of a core/shell nanoparticle (preferably, nanocrystal), having any associated organic coating or other material on the surface of the nanoparticle as ligand that is not removed from the surface by ordinary solvation. Such composite particles are useful as "quantum dots," which have a tunable emission in the near ultraviolet (UV) to far infrared (IR) range as a result of the use of a semiconductor material.

The term "liquid composite" as used herein refers to a liquid form of solid inorganic nanoparticle (preferably nanocrystal or quantum dots typically having a core/shell structure) after surface functionalization by liquid ligands that are not removed from the surface by ordinary solvation. The "liquid composite" may have different sizes and types of the core/shell nanocrystals for designed color emitting.

The term "nanoparticle" refers to a particle having an average particle diameter in the range of 0.1 to 1000 nanometers such as in the range of 0.1 to 100 nanometers or in the range of 1 to 100 nanometers. The term "diameter" refers not only to the diameter of substantially spherical particles but also to the distance along the smallest axis of the structure. Suitable techniques for measuring the average particle diameter include, for example, scanning tunneling microscopy, light scattering, and transmission electron microscopy.

A "core" of a nanoparticle is understood to mean a nanoparticle (preferably, a nanocrystal) to which no shell has been applied or to the inner portion of a core/shell nanoparticle. A core of a nanoparticle can have a homogenous composition or its composition can vary with depth inside the core. Many materials are known and used in core nanoparticles, and many methods are known in the art for applying one or more shells to a core nanoparticle for core protection and performance and stability improvement. The core has a different composition than the one more shells. The core typically has a different chemical composition than the shell of the core/shell nanoparticle.

As used herein, the term "actinic radiation" refers to radiation in any wavelength range of the electromagnetic spectrum. The actinic radiation is typically in the ultraviolet wavelength range, in the visible wavelength range, in the infrared wavelength range, or combinations thereof. Any suitable energy source known in the art can be used to provide the actinic radiation.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples may be used in various combinations. In each instance, the recited list serves only as a representative group and should not be interpreted as an exclusive list.

DETAILED DESCRIPTION

Figure 1:
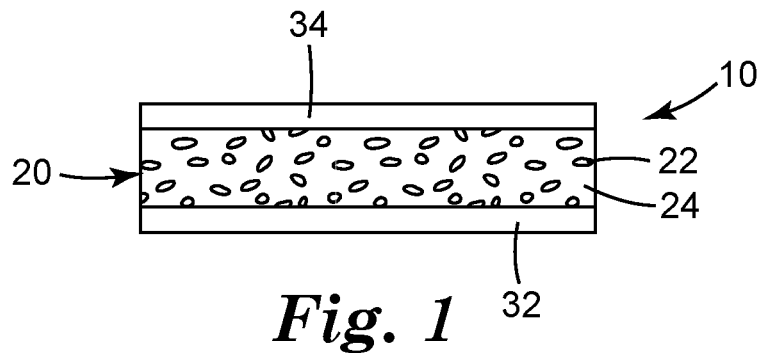
FIG. 1 is a schematic side elevation view of an edge region of an illustrative film article including quantum dots.

The present disclosure provides a liquid quantum dots composite comprising a fluorescent core/shell semiconductor nanoparticle, a first polyamine ligand, and second polythiol ligand, wherein at least one of said first and second ligand is a silicone ligand. The present disclosure provides liquid quantum dots composites that contain fluorescent semiconductor nanoparticles that can fluoresce at higher quantum efficiency due to the presence of the combined first polyamine ligand and second polythiol ligand when excited with actinic radiation, for example blue light. The liquid quantum dots composites can be used in coatings and films for applications, such as in optical displays.

Fluorescent semiconductor nanoparticles emit a fluorescence signal when suitably excited. They fluoresce at a second wavelength of actinic radiation when excited by a first wavelength of actinic radiation that is shorter than the second wavelength. In some embodiments, the fluorescent semiconductor nanoparticles can fluoresce in the visible region of the electromagnetic spectrum when exposed to wavelengths of light in the ultraviolet region of the electromagnetic spectrum. In other embodiments, the fluorescent semiconductor nanoparticles can fluoresce in the infrared region when excited in the ultraviolet or visible regions of the electromagnetic spectrum. In still other embodiments, the fluorescent semiconductor nanoparticles can fluoresce in the ultraviolet region when excited in the ultraviolet region by a shorter wavelength of light, can fluoresce in the visible region when excited by a shorter wavelength of light in the visible region, or can fluoresce in the infrared region when excited by a shorter wavelength of light in the infrared region. The fluorescent semiconductor nanoparticles are often capable of fluorescing in a wavelength range such as, for example, at a wavelength up to 1200 nanometers (nm), or up to 1000 nm, up to 900 nm, or up to 800 nm. For example, the fluorescent semiconductor nanoparticles are often capable of fluorescence in the range of 400 to 800 nanometers.

The emitting wavelength of the nanoparticles is sharply controlled by the nanoparticle size. Generally, the nanoparticles have an average particle diameter of at least 0.1 nanometer (nm), or at least 0.5 nm, or at least 1 nm. The nanoparticles have an average particle diameter of up to 1000 nm, or up to 500 nm, or up to 200 nm, or up to 100 nm, or up to 50 nm, or up to 20 nm, or up to 10 nm. Semiconductor nanoparticles, particularly with sizes on the scale of 1-10 nm, have emerged as a category of the most promising advanced materials for cutting-edge technologies.

Semiconductor materials include elements or complexes of Group 2-Group 16, Group 12-Group 16, Group 13-Group 15, Group 14-Group 16, and Group 14 semiconductors of the Periodic Table (using the modern group numbering system of 1-18). Some suitable quantum dots include a metal phosphide, a metal selenide, a metal telluride, or a metal sulfide. Exemplary semiconductor materials include, but are not limited to, Si, Ge, Sn, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, MgTe, GeS, GeSe, GeTe, SnS, SnSe, SnTe, PbO, PbS, Pb Se, PbTe, CuF, CuCl, CuBr, CuI, $Si_3N_4$, $Ge_3N_4$, $Al_2O_3$, $(Ga,In)_2(S,Se,Te)_3$, $Al_2CO$, CaS, CaSe, CaTe, SrS, SrSe, SrTe, BaS, BaSe, BaTe, and an appropriate combination of two or more such semiconductors. These semiconductor materials can be used for the core, the one or more shell layers, or both.

In certain embodiments, exemplary metal phosphide quantum dots include indium phosphide and gallium phosphide, exemplary metal selenide quantum dots include cadmium selenide, lead selenide, and zinc selenide, exemplary metal sulfide quantum dots include cadmium sulfide, lead sulfide, and zinc sulfide, and exemplary metal telluride quantum dots include cadmium telluride, lead telluride, and zinc telluride. Other suitable quantum dots include gallium arsenide and indium gallium phosphide. Exemplary semiconductor materials are commercially available from Evident Technologies (Troy, N.Y.).

Nanocrystals (or other nanostructures) for use in the present invention can be produced using any method known to those skilled in the art. Suitable methods are disclosed in U.S. Pat. No. 6,949,206 (Whiteford, incorporated by reference herein in their entireties. The nanocrystals (or other nanostructures) for use in the present invention can be produced from any suitable material, suitably an inorganic material, and more suitably an inorganic conductive or semiconductive material. Suitable semiconductor materials include those disclosed in and include any type of semiconductor, including group 12-16, group 13-15, group 14-16 and group 14 semiconductors.

Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, As, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Ga, In)_2(S, Se, Te)_3$, $Al_2CO$, and an appropriate combination of two or more such semiconductors.

In certain aspects, the semiconductor nanocrystals or other nanostructures may comprise a dopant from the group consisting of: a p-type dopant or an n-type dopant. The nanocrystals (or other nanostructures) useful in the present invention can also comprise Group 12-Group 16 or Group 13-Group 15 semiconductors. Examples of Group 12-Group 16 or Group 13-Group 15 semiconductor nanocrystals and nanostructures include any combination of an element from Group 12, such as Zn, Cd and Hg, with any element from Group 16, such as S, Se, Te, Po, of the Periodic Table; and any combination of an element from Group 13, such as B, Al, Ga, In, and Tl, with any element from Group 15, such as N, P, As, Sb and Bi, of the Periodic Table.

Other suitable inorganic nanostructures include metal nanostructures. Suitable metals include, but are not limited to, Ru, Pd, Pt, Ni, W, Ta, Co, Mo, Ir, Re, Rh, Hf, Nb, Au, Ag, Ti, Sn, Zn, Fe, FePt, and the like.

While any known method can be used to create nanocrystal phosphors, suitably, a solution-phase colloidal method for controlled growth of inorganic nanomaterial phosphors is used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J. Am. Chem. Soc. 115:8706 (1993).

This manufacturing process technology leverages low cost processability without the need for clean rooms and expensive manufacturing equipment. In these methods, metal precursors that undergo pyrolysis at high temperature are rapidly injected into a hot solution of organic surfactant molecules. These precursors break apart at elevated temperatures and react to nucleate nanocrystals. After this initial nucleation phase, a growth phase begins by the addition of monomers to the growing crystal. The result is freestanding crystalline nanoparticles in solution that have an organic surfactant molecule coating their surface.

Using this approach, synthesis occurs as an initial nucleation event that takes place over seconds, followed by crystal growth at elevated temperature for several minutes. Parameters such as the temperature, types of surfactants present, precursor materials, and ratios of surfactants to monomers can be modified so as to change the nature and progress of the reaction. The temperature controls the structural phase of the nucleation event, rate of decomposition of precursors, and rate of growth. The organic surfactant molecules mediate both solubility and control of the nanocrystal shape.

In semiconductor nanocrystals, photo-induced emission arises from the band edge states of the nanocrystal. The band-edge emission from nanocrystals competes with radiative and non-radiative decay channels originating from surface electronic states. X. Peng, et al., J. Am. Chem. Soc. 30:7019-7029 (1997). As a result, the presence of surface defects such as dangling bonds provide non-radiative recombination centers and contribute to lowered emission efficiency. An efficient and permanent method to passivate and remove the surface trap states is to epitaxially grow an inorganic shell material on the surface of the nanocrystal. X. Peng, et al., J. Am. Chem. Soc. 30:7019-7029 (1997). The shell material can be chosen such that the electronic levels are type I with respect to the core material (e.g., with a larger bandgap to provide a potential step localizing the electron and hole to the core). As a result, the probability of non-radiative recombination can be reduced.

Core-shell structures are obtained by adding organometallic precursors containing the shell materials to a reaction mixture containing the core nanocrystal. In this case, rather than a nucleation-event followed by growth, the cores act as the nuclei, and the shells grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and ensure solubility. A uniform and epitaxially grown shell is obtained when there is a low lattice mismatch between the two materials. Additionally, the spherical shape acts to minimize interfacial strain energy from the large radius of curvature, thereby preventing the formation of dislocations that could degrade the optical properties of the nanocrystal system.

In suitable embodiments, ZnS can be used as the shell material using known synthetic processes, resulting in a high-quality emission. As above, if necessary, this material can be easily substituted, e.g., if the core material is modified. Additional exemplary core and shell materials are described herein and/or known in the art.

For many applications of quantum dots, two factors are typically considered in selecting a material. The first factor is the ability to absorb and emit visible light. This consideration makes InP a highly desirable base material. The second factor is the material's photoluminescence efficiency (quantum yield). Generally, Group 12-Group 16 quantum dots (such as cadmium selenide) have higher quantum yield than Group 13-Group 15 quantum dots (such as InP). The quantum yield of InP cores produced previously has been very low (<1%), and therefore the production of a core/shell structure with InP as the core and another semiconductor compound with higher bandgap (e.g., ZnS) as the shell has been pursued in attempts to improve the quantum yield.

Thus, the fluorescent semiconductor nanoparticles (i.e., quantum dots) of the present disclosure include a core and a shell at least partially surrounding the core. The core/shell nanoparticles can have two distinct layers, a semiconductor or metallic core and a shell surrounding the core of an insulating or semiconductor material. The core often contains a first semiconductor material and the shell often contains a second semiconductor material that is different than the first semiconductor material. For example, a first Group 12-Group 16 (e.g., CdSe) semiconductor material can be present in the core and a second Group 12-Group 16 (e.g., ZnS) semiconductor material can be present in the shell.

In certain embodiments of the present disclosure, the core includes a metal phosphide (e.g., indium phosphide (InP), gallium phosphide (GaP), aluminum phosphide (AlP)), a metal selenide (e.g., cadmium selenide (CdSe), zinc selenide (ZnSe), magnesium selenide (MgSe)), or a metal telluride (e.g., cadmium telluride (CdTe), zinc telluride (ZnTe)). In certain embodiments, the core includes a metal phosphide (e.g., indium phosphide) or a metal selenide (e.g., cadmium selenide). In certain preferred embodiments of the present disclosure, the core includes a metal phosphide (e.g., indium phosphide).

The shell can be a single layer or multilayered. In some embodiments, the shell is a multilayered shell. The shell can include any of the core materials described herein. In certain embodiments, the shell material can be a semiconductor material having a higher bandgap energy than the semiconductor core. In other embodiments, suitable shell materials can have good conduction and valence band offset with respect to the semiconductor core, and in some embodiments, the conduction band can be higher and the valence band can be lower than those of the core. For example, in certain embodiments, semiconductor cores that emit energy in the visible region such as, for example, CdS, CdSe, CdTe, ZnSe, ZnTe, GaP, InP, or GaAs, or near IR region such as, for example, InP, InAs, InSb, PbS, or PbSe may be coated with a shell material having a bandgap energy in the ultraviolet regions such as, for example, ZnS, GaN, and magnesium chalcogenides such as MgS, MgSe, and MgTe. In other embodiments, semiconductor cores that emit in the near IR region can be coated with a material having a bandgap energy in the visible region such as CdS or ZnSe.

Formation of the core/shell nanoparticles may be carried out by a variety of methods. Suitable core and shell precursors useful for preparing semiconductor cores are known in the art and can include Group 2 elements, Group 12 elements, Group 13 elements, Group 14 elements, Group 15 elements, Group 16 elements, and salt forms thereof. For example, a first precursor may include metal salt (M+X−) including a metal atom (M+) such as, for example, Zn, Cd, Hg, Mg, Ca, Sr, Ba, Ga, In, Al, Pb, Ge, Si, or in salts and a counter ion (X−), or organometallic species such as, for example, dialkyl metal complexes. The preparation of a coated semiconductor nanocrystal core and core/shell nanocrystals can be found in, for example, Dabbousi et al. (1997) *J. Phys. Chem. B* 101:9463, Hines et al. (1996) *J. Phys. Chem.* 100: 468-471, and Peng et al. (1997) *J. Amer. Chem. Soc.* 119:7019-7029, as well as in U.S. Pat. No. 8,283,412 (Liu et al.) and International Publication No. WO 2010/039897 (Tulsky et al.).

In certain preferred embodiments of the present disclosure, the shell includes a metal sulfide (e.g., zinc sulfide or cadmium sulfide). In certain embodiments, the shell includes a zinc-containing compound (e.g., zinc sulfide or zinc selenide). In certain embodiments, a multilayered shell includes an inner shell overcoating the core, wherein the inner shell includes zinc selenide and zinc sulfide. In certain embodiments, a multilayered shell includes an outer shell overcoating the inner shell, wherein the outer shell includes zinc sulfide.

In some embodiments, the core of the shell/core nanoparticle contains a metal phosphide such as indium phosphide, gallium phosphide, or aluminum phosphide. The shell contains zinc sulfide, zinc selenide, or a combination thereof. In some more particular embodiments, the core contains indium phosphide and the shell is multilayered with the inner shell containing both zinc selenide and zinc sulfide and the outer shell containing zinc sulfide.

The thickness of the shell(s) may vary among embodiments and can affect fluorescence wavelength, quantum yield, fluorescence stability, and other photostability characteristics of the nanocrystal. The skilled artisan can select the appropriate thickness to achieve desired properties and may modify the method of making the core/shell nanoparticles to achieve the appropriate thickness of the shell(s).

The diameter of the fluorescent semiconductor nanoparticles (i.e., quantum dots) of the present disclosure can affect the fluorescence wavelength. The diameter of the quantum dot is often directly related to the fluorescence wavelength. For example, cadmium selenide quantum dots having an average particle diameter of about 2 to 3 nanometers tend to fluoresce in the blue or green regions of the visible spectrum while cadmium selenide quantum dots having an average particle diameter of about 8 to 10 nanometers tend to fluoresce in the red region of the visible spectrum.

The fluorescent semiconductor nanoparticles are surface-modified with a surface modifying agent to enhance their dispersibility in a liquid. That is, the surface modifying agent tends to increase compatibility of the fluorescent semiconductor nanoparticles with a non-aqueous solvent, and any other components of a composition (e.g., a polymeric material, precursors of the polymeric material, or combinations thereof).

Surface modification involves combining the fluorescent semiconductor nanoparticles with a surface modifying agent or combination of surface modifying agents that attach to the surface of the fluorescent semiconductor nanoparticles and that modify the surface characteristics of the fluorescent semiconductor nanoparticles. In this context, "attach" or "attached" refers to the association between the surface modifying agent and the fluorescent semiconductor nanoparticle, which is of sufficient stability for the surface modified particles to be suitable for their intended use. The association may be physical (e.g., by absorption or adsorption), chemical (e.g., through covalent bonds, ionic bonds, hydrogen bonds), or a combination thereof.

Surface modifying agents include one or more groups for attaching to the surface of the fluorescent semiconductor nanoparticles and one or more group for various functions, such as compatibilizing the particles with a solvent, improving the quantum yield of the material. The groups attach to the surface, for example, by adsorption, formation of an ionic bond, formation of a covalent bond, formation of a hydrogen bond, formation of an electron donor-acceptor bond, or a combination thereof.

Quantum efficiency (also known in the literature as quantum yield) is the number of defined events which occur per photon absorbed (e.g., the number of photons emitted by the nanoparticles per photon absorbed by the nanoparticles). Accordingly, one general embodiment of the present disclosure provides a population of nanoparticles that displays a quantum efficiency of 45% or greater, or 50% or greater, or 70% or greater, or 85% or greater.

Useful polyamine ligand compounds in the liquid quantum dots composite correspond to primary and secondary amines of the formula:

  I and include primary and secondary (hetero)hydrocarbyl monoamines and polyamines. $R^{10}$ a polymeric, oligomeric or non-polymeric group having a valence of m, and is the residue of a mono-, di- or higher amine. $R^9$ is H or alkyl group which may comprising additional —NH— or —NH$_2$ group or the combination thereof. Preferably, $R^9$ is H In some embodiments $R^{10}$ may be polymeric or non-polymeric (hetero)hydrocarbyl group that has a valence of m, and is the residue of a mono-, di- or higher amine. $R^{10}$ can be an alkyl, a cycloalkyl or aryl or the combination thereof and m is at least 2. $R^{10}$ may be selected from mono- and polyvalent (hetero)hydrocarbyl (i.e., alkyl and aryl compounds having 1 to 30 carbon atoms, or alternatively (hetero)hydrocarbyl including heteroalkyl and heteroaryl having 1 to twenty heteroatoms of oxygen.

Linear or branched aliphatic, aromatic, cycloaliphatic, and oligomeric di- and polyamines all are considered useful in the practice of the invention. Representative of the classes of useful di- or polyamines are 4,4'-methylene dianiline, 3,9-bis-(3-aminopropyl)-2,4,8,10-tetraoxaspiro[5,5]undecane, and polyoxyethylenediamine. Useful diamines include N-methyl-1,3-propanediamine; N-ethyl-1,2-ethanediamine; 2-(2-aminoethylamino)ethanol; pentaethylenehexaamine; ethylenediamine; N-methylethanolamine; and 1,3-propanediamine.

Examples of useful polyamines include polyamines having at least three amino groups, wherein at least one of the three amino groups are primary, and the remaining may be primary, secondary, or a combination thereof. Examples include $H_2N(CH_2CH_2NH)_{1-10}H$, $H_2N(CH_2CH_2CH_2CH_2NH)_{1-10}H$, $H_2N(CH_2CH_2CH_2CH_2CH_2CH_2NH)_{1-10}H$, $H_2N(CH_2)_3NHCH_2CH=CHCH_2NH(CH_2)_3NH_2$, $H_2N(CH_2)_4NH(CH_2)_3NH_2$, $H_2N(CH_2)_3NH(CH_2)_4NH(CH_2)_3NH_2$, $H_2N(CH_2)_3NH(CH_2)_2NH(CH_2)_3NH_2$, $H_2N(CH_2)_2NH(CH_2)_3NH(CH_2)_2NH_2$, $H_2N(CH_2)_3NH(CH_2)_2NH_2$, $C_6H_5NH(CH_2)_2NH(CH_2)_2NH_2$, and $N(CH_2CH_2NH_2)_3$, and polymeric polyamines such as linear or branched (including dendrimers) homopolymers and copolymers of ethyleneimine (i.e., aziridine). Many such compounds can be obtained, or are available, from general chemical suppliers such as, for example, Aldrich Chemical Company, Milwaukee, Wis. or Pfaltz and Bauer, Inc., Waterbury, Conn.

Many di- and polyamines, such as those just named, are available commercially, for example, those available from Huntsman Chemical, Houston, Tex. The most preferred di- or polyamines include aliphatic di- and triamines or aliphatic di- or polyamines and more specifically compounds with two or three primary amino groups, such as ethylene diamine, hexamethylene diamine, dodecanediamine, and the like.

In some embodiments the polyamine ligand is an aminosilicone is of the formula:

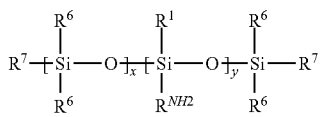

wherein
each $R^6$ is independently an alkyl or aryl;
each $R^1$ is independently an alkyl or aryl;
$R^{NH2}$ is an amine-substituted (hetero)hydrocarbyl group;
x is 1 to 2000; preferably 3 to 100;
y may be zero;
x+y is at least one;
$R^7$ is alkyl, aryl or $R^{NH2}$
wherein amine-functional silicone has at least two $R^{NH2}$ groups. With respect to Formula I, $R^{10}$ can be a polysiloxane or silicone.

Useful amino-silicones, and method of making the same, are described in US 2013/0345458 (Freeman et al.), incorporated herein by reference. Useful amine-functional silicones are described in Lubkowsha et al., Aminoalkyl Functionalized Siloxanes, Polimery, 2014 59, pp 763-768, and are available from Gelest Inc, Morrisville, Pa., from Dow Corning under the Xiameter™, including Xiamter OFX-0479, OFX-8040, OFX-8166, OFX-8220, OFX-8417, OFX-8630, OFX-8803, and OFX-8822. Useful amine-functional silicones are also available from Siletech.com under the tradenames Silamine™, and from Momentive.com under the tradenames ASF3830, SF4901, Magnasoft, Magnasoft PlusTSF4709, Baysilone OF-TP3309, RPS-116, XF40-C3029 and TSF4707.

Amine end-blocked silicones from Genesee Polymer Co. (GP-965, GP-468, GP-654 and GP-966) have the following formula:

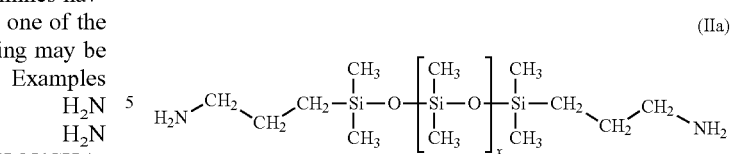

Pendant amine/dimethyl silicones from Genesee Polymer Co. (GP-4, GP-5, GP-581, GP-344, GP-342, GP-316 and GP-345) have the following general formula:

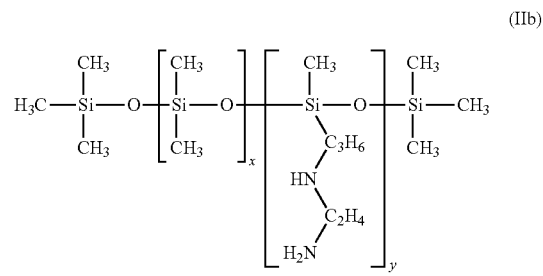

Pendant amine/dimethyl silicones from Gelest (AMS-132, AMS-152 and AMS-162) have the following general formula:

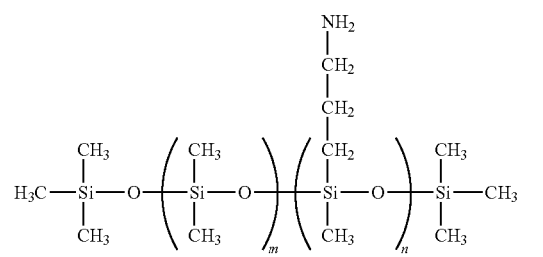

Some useful polymeric aminosilicones have been claimed as ligands for semiconductor nanocrystals in U.S. Pat. No. 8,283,412, incorporated herein as reference.

One or more amine-functionalized ligands may be presented in the liquid composite attached on the surface of the quantum dots.

The polythiol ligand used in the liquid quantum dots composite may be of the formula:

$$R^2(SH)_y, \quad \text{III}$$

where $R^2$ is a polymeric or non-polymeric group having a valence of y, and y is ≥2, preferably >2. In some embodiments, the $R^2$ may be a polymeric or non-polymeric (hetero) hydrocarbyl group. In some embodiments the $R^2$ may be a polymeric polysiloxane. The thiol groups of the polythiols may be primary or secondary. The compounds of Formula III may include a mixture of compounds having an average functionality of two or greater.

$R^2$ includes any (hetero)hydrocarbyl groups, including aliphatic and aromatic polythiols. $R^2$ may optionally further include one or more functional groups including pendent hydroxyl, acid, ester, or cyano groups or catenary (in-chain) ether, urea, urethane and ester groups.

In one embodiment, $R^2$ comprises a non-polymeric aliphatic or cycloaliphatic moiety having from 1 to 30 carbon atoms. In another embodiment, $R^2$ is polymeric and comprises a polyoxyalkylene, polyester, polyolefin, polyacrylate, or polysiloxane polymer having pendent or terminal reactive —SH groups. Useful polymers include, for example, thiol-terminated polyethylenes or polypropylenes, and thiol-terminated poly(alkylene oxides).

Specific examples of useful polythiols include 2,3-dimercapto-1-propanol, 2-mercaptoethyl ether, 2-mercaptoethyl sulfide, 1,6-hexanedithiol, 1,8-octanedithiol, 1,8-dimercapto-3,6-dithiaoctane, propane-1,2,3-trithiol, and trithiocyanuric acid.

Another useful class of polythiols includes those obtained by esterification of a polyol with a terminally thiol-substituted carboxylic acid (or derivative thereof, such as esters or acyl halides) including α- or β-mercaptocarboxylic acids such as thioglycolic acid, β-mercaptopropionic acid, 2-mercaptobutyric acid, or esters thereof.

Useful examples of commercially available compounds thus obtained include 1,6-dimercaptohexane, 1,10-decanedithiol, 1,4-benzenedimethanethiol, ethylene glycol bis(thioglycolate), 1,4-butanediol bis(thioglycolate), tetraethylene glycol bis(3-mercaptopropionate), pentaerythritol tetrakis (3-mercaptopropionate), dipentaerythritol hexakis(3-mercaptopropionate), ethylene glycol bis(3-mercaptopropionate), trimethylolpropane tris(thioglycolate), trimethylolpropane tris(3-mercaptopropionate), pentaerythritol tetrakis(thioglycolate), pentaerythritol tetrakis(3-mercaptopropionate), pentaerithrytol tetrakis (3-mercaptobutylate), and 1,4-bis 3-mercaptobutylyloxy butane, tris[2-(3-mercaptopropionyloxy]ethyl]isocyanurate, trimethylolpropane tris(mercaptoacetate), 2,4-bis(mercaptomethyl)-1,3,5,-triazine-2,4-dithiol, 2,3-di(2-mercaptoethyl)thio)-1-propanethiol, dimercaptodiethylsufide, and ethoxylated trimethylpropan-tri(3-mercaptopropionate.

A specific example of a polymeric polythiol is polypropylene ether glycol bis(3-mercaptopropionate) which is prepared by esterification of polypropylene-ether glycol (e.g., Pluracol™ P201, BASF Wyandotte Chemical Corp.) and 3-mercaptopropionic acid by esterification.

Useful soluble, high molecular weight thiols include polyethylene glycol di(2-mercaptoacetate), LP-3™ resins supplied by Morton Thiokol Inc. (Trenton, N.J.), and Permapol P3™ resins supplied by Products Research & Chemical Corp. (Glendale, Calif.) and compounds such as the adduct of 2-mercaptoethylamine and caprolactam.

In some embodiments the polythiols include the following:

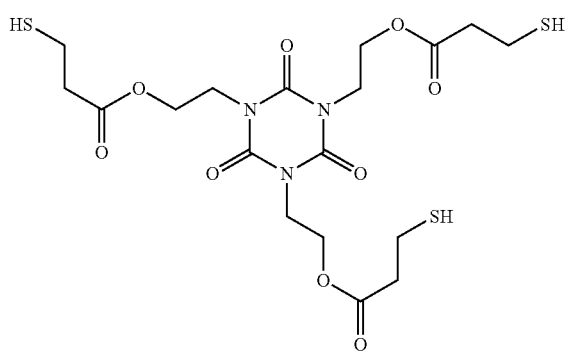

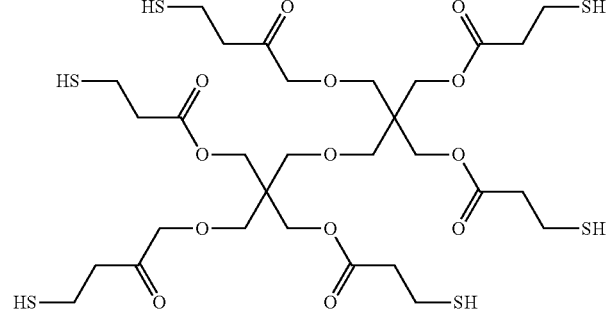

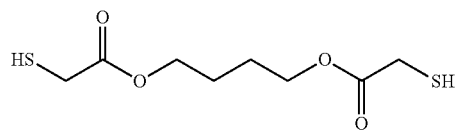

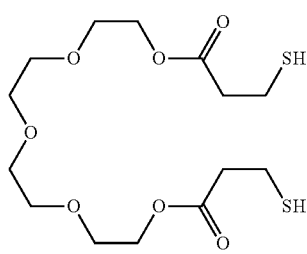

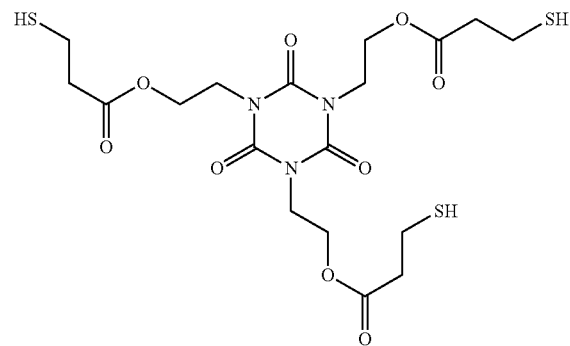

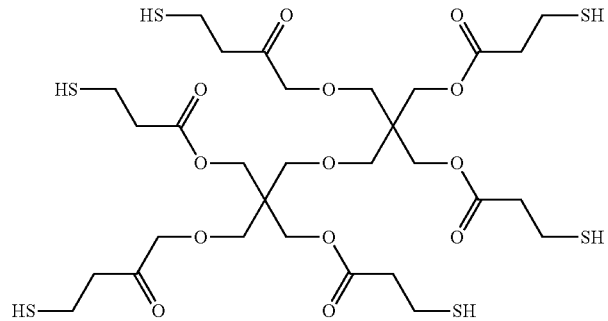

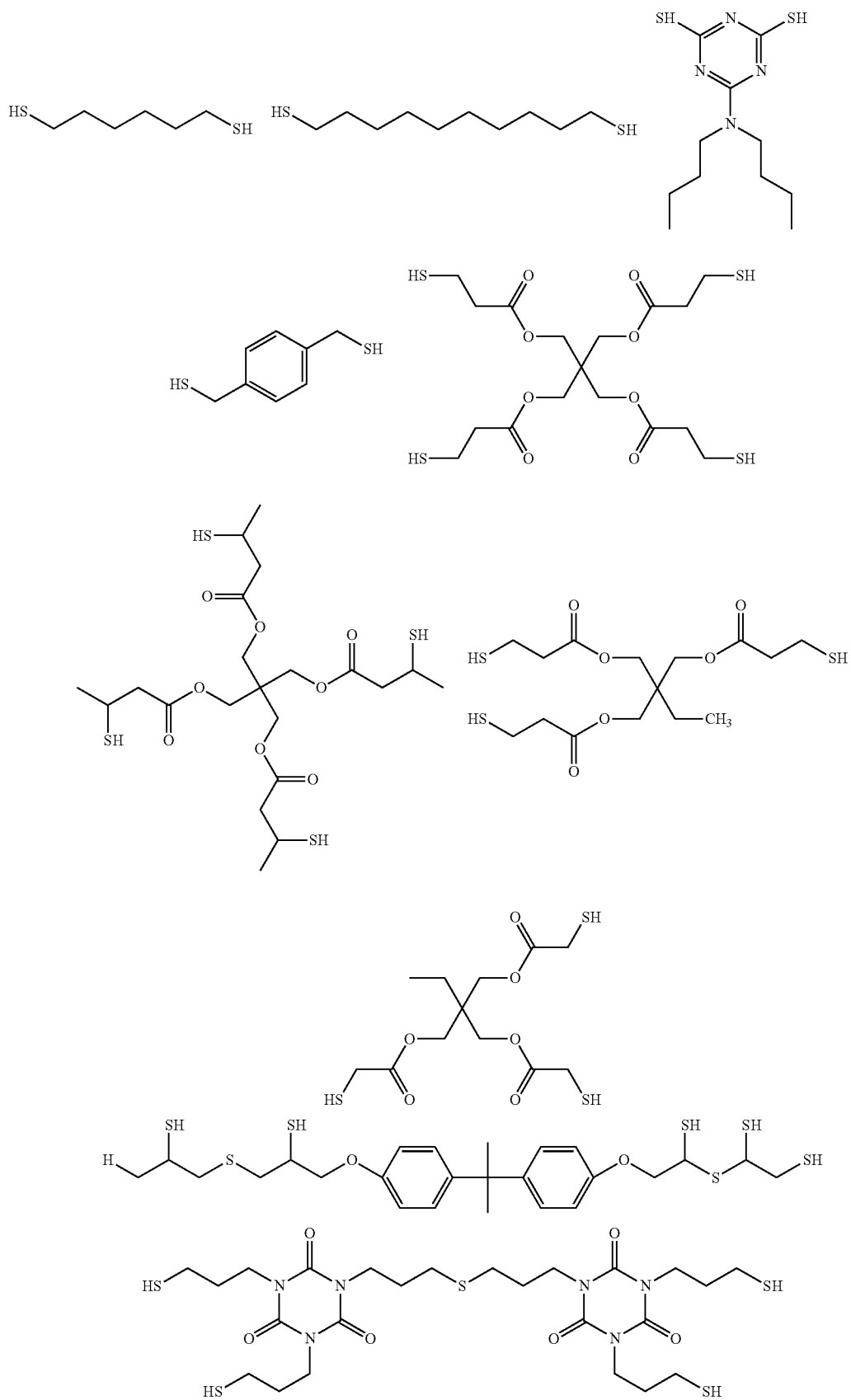

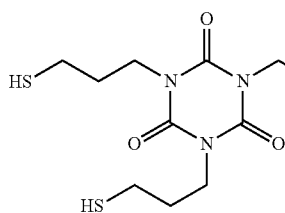 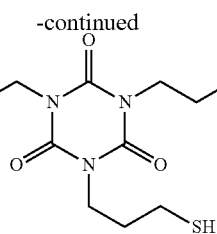 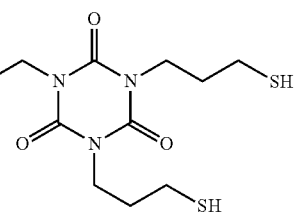

In some embodiments, the polythiol ligand is a polythiol functionalized silicone. The thiol-substituted silicone ligand (prior to attachment to the nanoparticle) has the following formula IV:

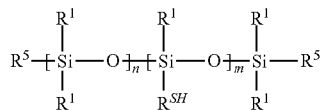

IV wherein
each $R^1$ is independently an alkyl or aryl;
$R^{SH}$ is a thiol-substituted (hetero)hydrocarbyl group;
n is 0 to 2000;
m may be zero;
n+m is at least one;
$R^5$ is alkyl, aryl or $R^{SH}$;
wherein thiol-functional silicone has at least one $R^{SH}$ group Such thiol-substituted silicones can be prepared by reaction of a trialkylsilane and dialkylsilane in the presence of acid. More particularly the silicones having pendent thiol groups may be prepared by:
hydrolyzing a mercapto-functional silane of the formula

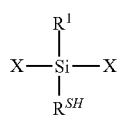

V and an organosilane corresponding to the formula:

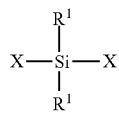

VI wherein R and R' are each, independently selected from the group consisting of alkyl, aryl, alkaryl, aralkyl and halogenated hydrocarbon radicals, in the presence of a hydrolysis acid; and
(b) reacting together in the presence of an acid catalyst the hydrolyzed silanes of (a) with (1) an end-blocking polyalkylpolysiloxane and (2) a chain-extender which is either a cyclic polysiloxane or an alkyl or hydroxy-terminated silicone fluid, or a trialkylsilane of the formula:

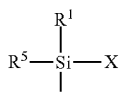

VII where
each $R^1$ is independently an alkyl or aryl;
$R^{SH}$ is a thiol-substituted (hetero)hydrocarbyl group;
$R^5$ is alkyl, aryl or $R^{SH}$;
and X is a hydrolysable group, including alkoxy, acyloxy and halide.

It will be appreciated that the dialkylsiloxanes of Formula IV will also include cyclic siloxanes such as hexamethylcyclotrisiloxane, octamethylcyclotetrasiloxane decamethylcyclopentasiloxane and dodecamethylcyclohexasiloxane.

Alternatively, silicones having terminal thiol groups may be prepared by hydrolyzing an organosilane corresponding to the formula III in the presence of an acid catalyst and reacting the resulting silicone with a thiol-substituted silane of the formula

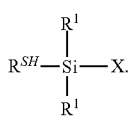

VII

It will be appreciated that silicones substituted with both terminal and pendent thiol groups may be prepared using the above method. Further details regarding the preparation may be found in U.S. Pat. No. 4,622,412 (Piskoti) and in U.S. Pat. No. 5,015,717 (Martin et al.), incorporated herein by reference.

Useful representative commercially available mercapto-pendent silicones (GP-710, GP-71-SS, GP-656, GP-800, GP-367 and GP-7200 from Genesee Polymers) have the following general formula IVa and IVb:

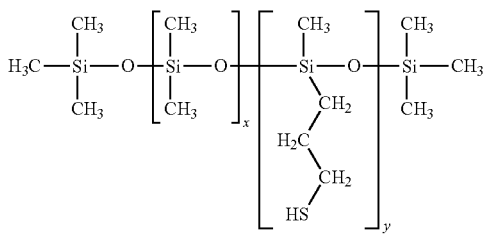

(IVa)

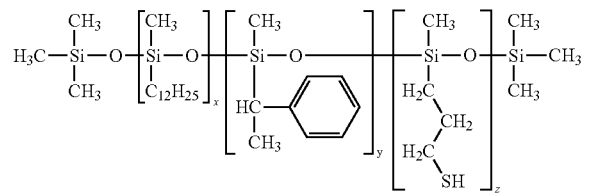

(IVb)

Useful representative commercially available mercapto-end blocked silicones (GP-970 and ZGP-974 from Genesee Polymers) have the following general formula:

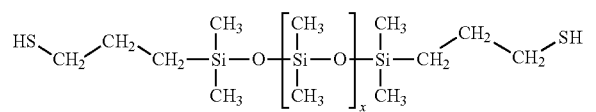

(IVc)

Some useful polymeric mercaptosilicones have been claimed as ligands for semiconductor nanocrystals in Applicant's US2015/018254 (Qiu et al.), incorporated herein by reference.

More than one mercapto-functionalized ligands may be presented in the liquid composite attached on the surface of the quantum dots.

The polyamine and polythiol ligands perform several functions. They help prevent quantum dots from clustering and quenching, they can improve the chemical stability of the quantum dot surface, and they can improve the emission efficiency of the quantum dots.

In some embodiments the amount of combined polythiol and polyamine ligands are ≥50 wt. %, preferably ≥60 wt. %, more preferably ≥70 wt. %, relative to the total including the liquid composite including the inorganic nanoparticles. In other words, the ligand stabilized quantum dots comprise ≥50 wt. % of ligand compound of Formula IV and/or silicone of Formula III, relative to the total weight of the stabilized quantum dots. In some embodiments the amount of functionalized silicone ligand is ≥50 wt. % in the total ligands combined. In other words, the ligand stabilized quantum dots comprise ≥50 wt. % of silicone ligand compound of Formula II or Formula IV or combined Formula II and Formula IV, relative to the total weight of the ligands. The molar ratio of thiol groups of the polythiol to amine groups of the amine ligand may be 1:1 to 1:100.

Various methods can be used to surface modify the fluorescent semiconductor nanoparticles with the ligand compounds. In some embodiments, procedures similar to those described in U.S. Pat. No. 7,160,613 (Bawendi et al.) and U.S. Pat. No. 8,283,412 (Liu et al.) can be used to add the ligands. For example, the ligand compounds and the fluorescent semiconductor nanoparticles can be heated at an elevated temperature (e.g., at least 50° C., at least 60° C., at least 80° C., or at least 90° C.) for an extended period of time (e.g., at least 1 hour, at least 5 hours, at least 10 hours, at least 15 hours, or at least 20 hours).

Since carboxylic acids are often used as surfactants in the synthesis of InP/ZnS core/shell particles, the quantum dots may have acid functional ligands attached thereto, prior to dispersing in the stabilizing agent. Similarly, CdSe quantum dots may be functionalized with amine-functional ligands as result of their preparation, prior to functionalization with the instant ligands. As result, the quantum dots may be functionalized with those surface modifying additives or ligands resulting from the original synthesis of the nanoparticles.

As result, the quantum dots may be surface modified with auxiliary ligands of the formula:

$$R^{15}-R^{12}(Z)_z \qquad \text{VIII}$$

wherein
$R^{15}$ is (hetero)hydrocarbyl group having $C_2$ to $C_{30}$ carbon atoms;
$R^{12}$ is a hydrocarbyl group including alkylene, arylene, alkarylene and aralkylene;
Subscript z is at least one;
Z is a ligand group, including $—CO_2H$, $—SO_3H$, $—P(O)(OH)_2$, $—OP(O)(OH)$, $—OH$, $—SH$ and $—NH_2$.

For study the performance of the liquid composite comprising the core/shell fluorescent semiconductor nanoparticle and the effect of combined first amine-functionalized ligand and second polythiol ligand, a solvent or co-solvents is used. The solvent should be low in polar or even no polar for eliminating any possible effect on the structure of the liquid composite, bonding and de-bonding of ligands on the surface of core/shell fluorescent semiconductor nanoparticle. At the same time, the solvent should have solubility for the organic ligand stabilized core/shell fluorescent semiconductor nanoparticle, the first amine-functionalized ligand and the second polythiol ligand, The representative useful solvents are, for example, hexane, heptane, octane, toluene, etc. and the combination thereof.

If desired, any by-product of the synthesis process or any solvent used in surface-modification process can be removed, for example, by distillation, rotary evaporation, or by precipitation of the nanoparticles and centrifugation of the mixture followed by decanting the liquid and leaving behind the surface-modified nanoparticles. In some embodiments, the surface-modified fluorescent semiconductor nanoparticles are dried to a powder after surface-modification. In other embodiments, the solvent used for the surface modification is compatible (i.e., miscible) with any carrier fluids used in compositions in which the nanoparticles are included. In these embodiments, at least a portion of the solvent used for the surface-modification reaction can be included in the carrier fluid in which the surface-modified, fluorescent semiconductor nanoparticles are dispersed.

A curable liquid binder is used in the coating composition comprising the liquid quantum dots composite. To formulate the coating composition the ligand stabilized fluorescent semiconductor nanoparticles (liquid quantum dots composite) may first be dispersed in one or more (a) curable liquid binder composition(s), a precursor(s) of the cured polymeric binder, by high speed shearing mixing.

Any liquid polymerizable or curable materials having the viscosity less than 20000 cSt and cured $T_g$ higher than room temperature may be used as the curable liquid binder for easy coating. Preferred curable liquid binder should have good oxygen and moisture barrier properties and good heat and/or photo stability for quantum dots protection, which are colorless and high transparent when viewed with the human eye for specific applications (e.g. displays), and having a $T_g$ at least 20° C. for high thermal stability after curing. More preferably, the curable liquid binder has refractive index 1.5 and higher, so there is a refractive index difference ≥0.05 to the surface of liquid composite emulsion droplets, which have at least one low refractive index silicone ligand, 1.45 or less.

The term transparent means transmitting at least 85% of incident light in the visible spectrum (about 400-700 nm wavelength). The term colorless means having a CIELAB b* less than about 1.5 units, preferably less than about 1.0 unit for samples with thickness of 500 microns.

Generally, the liquid quantum dots composite and the curable liquid polymeric binder are combined to make the coating formulation which is subjected to high shear mixing to produce a uniform emulsion dispersion (or as coating composition) of the liquid quantum dots composite in the curable liquid polymeric binder.

The binder is chosen such there is limited compatibility with the liquid composite to prevent the quantum dots form a separate, non-aggregating phase in the binder. Preferably, the liquid binder has high refractive index of 1.5 or higher. Generally, the coating composition has 1-20% by weight of the liquid quantum dots composite of organic ligand-functional inorganic quantum dots. The dispersion is then coated and cured either thermally, free-radically, or both to cure the binder to a solid matrix to lock the liquid composite droplets in the dispersed structure and exclude oxygen and water from the dispersed quantum dots. Generally, the curing temperature is ≤160° C., preferably ≤120° C. More preferably, the curing temperature is ≤110° C. Most preferably, the curing is at ambient temperature, such as cured by irradiation or E-Beam.

The cured polymeric binders desirably provide barrier properties to exclude oxygen and moisture. If water and/or oxygen enter the quantum dot article, the quantum dots can degrade and ultimately fail to emit light when excited by ultraviolet or blue light irradiation. Slowing or eliminating quantum dot degradation along the laminate edges is particularly important to extend the service life of the displays in smaller electronic devices such as those utilized in, for example, handheld devices and tablets.

Exemplary of cured polymeric materials include, but are not limited to, polysiloxanes, fluoroelastomers, fluoroplastics, polyamines, polyamides, polyimides, caprolactones, caprolactams, polyethers, polythioether, polyurethanes, polythiourethane, polyureas, polyvinyl alcohols, polyvinyl chlorides, polyvinyl acetates, polyesters, polycarbonates, polyacrylates, polymethacrylates, polyacrylamides, polymethacrylamides, and the combination thereof for optimized balanced performance. Suitable precursors of the cured polymeric material (i.e., precursor materials) or the curable liquid polymeric binder include any precursor materials used to prepare the cured polymeric materials listed above. Exemplary precursor materials include acrylates that can be polymerized to polyacrylates, methacrylates that can be polymerized to form polymethacrylates, acrylamides that can be polymerized to form polyacrylamides, methacrylamides that can be polymerized to form polymethacrylamides, polythiol and polyene that can be polymerized to form polythioethers, epoxy resins and dicarboxylic acids that can be polymerized to form polyesters, epoxy resins that can be polymerized to form polyethers, epoxy resins and polyamines or polythiols that can be polymerized to form polyhydroxyamines or polythioethers, isocyanates and polyols or polythiols or polyamine that can be polymerized to form polyurethanes or polythiourethane or polyureas, or polyols and dicarboxylic acids that can be polymerized to form polyesters.

In some embodiments, the curable liquid binder is a thermal curable epoxy-thiol composition. Such binders are described in Applicant's application U.S. 62/148,209 filed 16 Apr. 2015 and incorporated herein by reference.

In some embodiments, the curable liquid binder is a thermally curable epoxy-amine composition optionally further comprising a radiation-curable acrylate. Such binders are described in Applicant's U.S. 61/919,219 (Eckert et al.=WO 2015/095296), incorporated herein by reference.

In some embodiments, the curable liquid binder is a thermal curable epoxy-thiol composition comprising a radiation-curable thiol-ene. Such binders are described in Applicant's published application WO 2016/168048, incorporated herein by reference.

In some embodiments, the curable liquid binder is a fully UV curable thiol-ene composition. Such binders are described in Applicant's published application WO 2016/081219, incorporated herein by reference.

In some preferred embodiments the curable liquid binder is a radiation curable oligomer having the general formula $R^{Olig}\text{-}(L^1\text{-}Z^1)_d$, wherein $R^{Olig}$ groups include urethanes, polyurethanes, esters, polyesters, polyethers, polyolefins, polybutadienes and epoxies;

$L^1$ is a linking group;

$Z^1$ is a pendent, free-radically polymerizable group such as (meth)acryloyl, vinyl or alkynyl and is preferably a (meth)acrylate, and d is greater than 1, preferably at least 2.

The linking group $L^1$ between the oligomer segment and ethylenically unsaturated end group includes a divalent or higher valency group selected from an alkylene, arylene, heteroalkylene, or combinations thereof and an optional divalent group selected from carbonyl, ester, amide, sulfonamide, or combinations thereof. $L^1$ can be unsubstituted or substituted with an alkyl, aryl, halo, or combinations thereof. The $L^1$ group typically has no more than 30 carbon atoms. In some compounds, the $L^1$ group has no more than 20 carbon atoms, no more than 10 carbon atoms, no more than 6 carbon atoms, or no more than 4 carbon atoms. For example, $L^1$ can be an alkylene, an alkylene substituted with an aryl group, or an alkylene in combination with an arylene or an alkyl ether or alkyl thioether linking group.

The pendent, free radically polymerizable functional groups $Z^1$ may be selected from the group consisting of vinyl, vinyl ether, ethynyl, and (meth)acyroyl which includes acrylate, methacrylate, acrylamide and methacrylamide groups.

The oligomeric group $R^{olig}$ may be selected from poly (meth)acrylate, polyurethane, polyepoxide, polyester, polyether, polysulfide, polybutadiene, hydrogenated polyolefins (including hydrogenated polybutadienes, isoprenes and ethylene/propylene copolymers, and polycarbonate oligomeric chains.

As used herein, "(meth)acrylated oligomer" means a polymer molecule having at least two pendent (meth)acryloyl groups and a weight average molecular weight ($M_w$) as determined by Gel Permeation Chromatography of at least 1,000 g/mole and typically less than 50,000 g/mole.

(Meth)acryloyl epoxy oligomers are multifunctional (meth)acrylate esters and amides of epoxy resins, such as the (meth)acrylated esters of bisphenol-A epoxy resin. Examples of commercially available (meth)acrylated epoxies include those known by the trade designations EBECRYL 600 (bisphenol A epoxy diacrylate of 525 molecular weight), EBECRYL 605 (EBECRYL 600 with 25% tripropylene glycol diacrylate), EBECRYL 3700 (bisphenol-A diacrylate of 524 molecular weight) and EBECRYL 3720H (bisphenol A diacrylate of 524 molecular weight with 20% hexanediol diacrylate) available from Cytec Industries, Inc., Woodland Park, N.J.; and PHOTOMER 3016 (bisphenol A epoxy acrylate), PHOTOMER 3016-40R (epoxy acrylate and 40% tripropylene glycol diacrylate blend), and PHOTOMER 3072 (modified bisphenol A acrylate, etc.) available from BASF Corp., Cincinnati, Ohio, and Ebecryl 3708 (modified bisphenol A epoxy diacrylate) available from Cytec Industries, Inc., Woodland Park, N.J.

(Meth)acrylated urethanes are multifunctional (meth) acrylate esters of hydroxy terminated isocyanate extended polyols, polyesters or polyethers. (Meth)acrylated urethane oligomers can be synthesized, for example, by reacting a diisocyanate or other polyvalent isocyanate compound with a polyvalent polyol (including polyether and polyester polyols) to yield an isocyanate terminated urethane prepolymer. A polyester polyol can be formed by reacting a polybasic acid (e.g., terephthalic acid or maleic acid) with a polyhydric alcohol (e.g., ethylene glycol or 1,6-hexanediol). A polyether polyol useful for making the acrylate functionalized urethane oligomer can be chosen from, for example, polyethylene glycol, polypropylene glycol, poly(tetrahydrofuran), poly(2-methyl-tetrahydrofuran), poly(3-methyl-tetrahydrofuran) and the like. Alternatively, the polyol linkage of an acrylated urethane oligomer can be a polycarbonate polyol.

Subsequently, (meth)acrylates having a hydroxyl group can then be reacted with the terminal isocyanate groups of the prepolymer. Both aromatic and the preferred aliphatic isocyanates can be used to react with the urethane to obtain the oligomer. Examples of diisocyanates useful for making the (meth)acrylated oligomers are 2,4-tolylene diisocyanate, 2,6-tolylene diisocyanate, 1,3-xylylene diisocyanate, 1,4-xylylene diisocyanate, 1,6-hexane diisocyanate, isophorone diisocyanate and the like. Examples of hydroxy terminated acrylates useful for making the acrylated oligomers include, but are not limited to, 2-hydroxyethyl (meth)acrylate, 2-hydroxypropyl (meth)acrylate, α-hydroxybutyl acrylate, polyethylene glycol (meth)acrylate and the like.

A (meth)acrylated urethane oligomer can be, for example, any urethane oligomer having at least two acrylate functionalities and generally less than about six functionalities. Suitable (meth)acrylated urethane oligomers are also commercially available such as, for example, those known by the trade designations PHOTOMER 6008, 6019, 6184 (aliphatic urethane triacrylates) available from Henkel Corp.; EBECRYL 220 (hexafunctional aromatic urethane acrylate of 1000 molecular weight), EBECRYL 284 (aliphatic urethane diacrylate of 1200 molecular weight diluted with 12% of 1,6-hexanediol diacrylate), EBECRYL 4830 (aliphatic urethane diacrylate of 1200 molecular weight diluted with 10% of tetraethylene glycol diacrylate), and EBECRYL 6602 (trifunctional aromatic urethane acrylate of 1300 molecular weight diluted with 40% of trimethylolpropane ethoxy triacrylate), available from UCB Chemical; and SARTOMER CN1963, 963E75, 945A60, 963B80, 968, and 983) available from Sartomer Co., Exton, Pa.

Properties of these materials may be varied depending upon selection of the type of isocyanate, the type of polyol modifier, the reactive functionality and molecular weight. Diisocyanates are widely used in urethane acrylate synthesis and can be divided into aromatic and aliphatic diisocyanates. Aromatic diisocyanates are used for manufacture of aromatic urethane acrylates which have significantly lower cost than aliphatic urethane acrylates but tend to noticeably yellow on white or light colored substrates. Aliphatic urethane acrylates include aliphatic diisocyanates that exhibit slightly more flexibility than aromatic urethane acrylates that include the same functionality, a similar polyol modifier and at similar molecular weight.

The curable composition may comprise a functionalized poly(meth)acrylate oligomer, which may be obtained from the reaction product of: (a) from 50 to 99 parts by weight of (meth)acrylate ester monomer units that are homo- or co-polymerizable to a polymer (b) from 1 to 50 parts by weight of monomer units having a pendent, free-radically polymerizable functional group. Examples of such materials are available from Lucite International (Cordova, Tenn.) under the trade designations of Elvacite 1010, Elvacite 4026, and Elvacite 4059.

The (meth)acrylated poly(meth)acrylate oligomer may comprise a blend of an acrylic or hydrocarbon polymer with multifunctional (meth)acrylate diluents. Suitable polymer/diluent blends include, for example, commercially available products such as EBECRYL 303, 745 and 1710 all of which are available from Cytec Industries, Inc., Woodland Park, N.J.

The curable composition may comprise a (meth)acrylated polybutadiene oligomer, which may be obtained from a carboxyl- or hydroxyl-functionalized polybutadiene. By carboxyl or hydroxy functionalized polybutadiene is meant to designate a polybutadiene comprising free —OH or —COOH groups. Carboxyl functionalized polybutadienes are known, they have for example been described in U.S. Pat. No. 3,705,208 (Nakamuta et al.) and are commercially available under the trade name of Nisso PB C-1000 (Nisso America, New York, N.Y.). Carboxyl functionalized polybutadienes can also be obtained by the reaction of a hydroxyl functionalized polybutadiene (that is a polybutadiene having free hydroxyl groups) with a cyclic anhydride such as for example has been described in U.S. Pat. No. 5,587,433 (Boeckeler), U.S. Pat. No. 4,857,434 (Klinger) and U.S. Pat. No. 5,462,835 (Mirle).

Carboxyl and hydroxyl functionalized polybutadienes suitable for being used in the process according to the present invention contain besides the carboxyl and/or hydroxyl groups, units derived from the polymerization of butadiene. The polybutadiene (PDB) generally comprises 1-4 cis units/1-4 trans units/1-2 units in a ratio a/b/c where a, b and c range from 0 to 1 with a+b+c=1. The number average molecular weight ($M_n$) of the functionalized polybutadiene is preferably from 200 to 10000 Da. The $M_n$ is more preferably at least 1000. The $M_n$ more preferably does not exceed 5000 Da. The —COOH or —OH functionality is generally from 1.5 to 9, preferably from 1.8 to 6.

Exemplary hydroxyl and carboxyl polybutadienes include without limitation Poly BD R-20LM (hydroxyl functionalized PDB, a=0.2, b=0.6, c=0.2, $M_n$ 1230) and Poly BD R45-HT (hydroxyl functionalized PDB, a=0.2, b=0.6, c=0.2, $M_n$ 2800) commercialized by Atofina, Nisso-PB G-1000 (hydroxyl functionalized PDB, a=0, b<0.15, c>0.85, $M_n$ 1250-1650), Nisso-PB G-2000 (hydroxyl functionalized PDB, a=0, b<0.15, c>0.85, $M_n$ 1800-2200), Nisso-PB G-3000 (hydroxyl functionalized PDB, a=0, b<0.10, c>0.90, $M_n$ 2600-3200), Nisso-PB C-1000 (carboxyl functionalized PDB, a=0, b<0.15, c>0.85, Mn 1200-1550) obtainable from Nisso America, New York, N.Y.

When carboxyl functionalized polybutadienes obtained from the reaction of a hydroxyl functionalized polybutadiene with a cyclic anhydride are used, this cyclic anhydride preferably include phthalic anhydride, hexahydrophthalic anhydride, glutaric anhydride, succinic anhydride, dodecenylsuccinic anhydride, maleic anhydride, trimellitic anhydride, pyromellitic anhydride. Mixtures of anhydrides can also be used. The amount of anhydride used for the preparation of a carboxyl functionalized polybutadiene from a hydroxyl functionalized polybutadiene is generally at least 0.8 molar, preferably at least 0.9 molar and more preferably at least 0.95 molar equivalent per molar equivalents of —OH groups present in the polybutadiene.

A (meth)acrylated polybutadiene oligomer which is the reaction product of a carboxyl functionalized polybutadiene may be prepared with a (meth)acrylated monoepoxide. (Meth)acrylated mono-epoxides are known. Examples of (meth)acrylated mono-epoxides that can be used are glycidyl (meth)acrylate esters, such as glycidylacrylate, glycidylmethacrylate, 4-hydroxybutylacrylate glycidylether, bisphenol-A diglycidylether monoacrylate. The (meth)acrylated mono-epoxides are preferably chosen from glycidylacrylate and glycidylmethacrylate. Alternatively, a (meth)acrylated polybutadiene oligomer which is the reaction product of a hydroxyl functionalized polybutadiene may be prepared with a (meth)acrylate ester, or halide.

Some (meth)acrylated polybutadienes that can be used, for example, include Ricacryl 3100 and Ricacryl 3500, manufactured by Sartomer Company, Exton, Pa., USA, and Nisso TE-2000 available from Nisso America, New York, N.Y. Alternatively, other methacrylated polybutadienes can be used. These include dimethacrylates of liquid polybutadiene resins composed of modified, esterified liquid polybutadiene diols. These are available under the tradename CN301 and CN303, and CN307, manufactured by Sartomer Company, Exton, Pa., USA. Regardless which methacrylated polybutadiene is used with embodiments of the invention, the methacrylated polybutadiene can include a number of methacrylate groups per chain from about 2 to about 20.

Alternatively, the acrylate functionalized oligomers can be polyester acrylate oligomers, acrylated acrylic oligomers, polycarbonate acrylate oligomers or polyether acrylate oligomers. Useful polyester acrylate oligomers include CN293, CN294, and CN2250, 2281, 2900 from Sartomer Co. (Exton, Pa.) and EBECRYL 80, 657, 830, and 1810 from UCB Chemicals (Smyrna, Ga.). Suitable polyether acrylate oligomers include CN501, 502, and 551 from Sartomer Co. (Exton, Pa.). Useful polycarbonate acrylate oligomers can be prepared according to U.S. Pat. No. 6,451,958 (Sartomer Technology Company Inc., Wilmington, Del.).

In each embodiment comprising a (meth)acrylated oligomer, the curable binder composition optionally, yet preferably, comprises diluent monomer in an amount sufficient to reduce the viscosity of the curable composition such that it may be coated on a substrate. Generally, the composition may comprise up to about 70 wt-% diluent monomers to reduce the viscosity of the oligomeric component to less than 10000 centipoise and to improve the processability.

Useful monomers are desirably soluble or miscible in the (meth)acrylated oligomer, highly polymerizable therewith. Useful diluents are mono- and polyethylenically unsaturated monomers such as (meth)acrylates or (meth)acrylamides. Suitable monomers typically have a number average molecular weight no greater than 450 g/mole. The diluent monomer desirably has minimal absorbance at the wavelength of the radiation used to cure the composition. Such diluent monomers may include, for example, n-butyl acrylate, isobutyl acrylate, hexyl acrylate, 2-ethyl-hexylacrylate, isooctylacrylate, caprolactoneacrylate, isodecylacrylate, tridecylacrylate, laurylmethacrylate, methoxy-polyethylenglycol-monomethacrylate, laurylacrylate, tetrahydrofurfurylacrylate, ethoxy-ethoxyethyl acrylate and ethoxylated-nonylacrylate. Especially preferred are 2-ethylhexylacrylate, ethoxy-ethoxyethyl acrylate, tridecylacrylate and ethoxylated nonylacrylate. High $T_g$ monomers having one ethylenically unsaturated group and a glass transition temperature of the corresponding homopolymer of 50° C. or more which are suitable in the present invention, include, for example, N-vinylpyrrolidone, N-vinyl caprolactam, isobornyl acrylate, acryloylmorpholine, isobornylmethacrylate, phenoxyethylacrylate, phenoxyethylmethacrylate, methylmethacrylate and acrylamide.

Furthermore, the diluent monomers may contain an average of two or more free-radically polymerizable groups. A diluent having three or more of such reactive groups can be present as well. Examples of such monomers include: $C_2$-$C_{18}$ alkylenedioldi(meth)acrylates, $C_3$-$C_{18}$ alkylenetrioltri(meth)acrylates, the polyether analogues thereof, and the like, such as 1,6-hexanedioldi(meth)acrylate, trimethylolpropanetri(meth)acrylate, triethyleneglycoldi(meth)acrylate, pentaeritritoltri(meth)acrylate, and tripropyleneglycol di(meth)acrylate, and di-trimethylolpropane tetraacrylate.

Suitable preferred diluent monomers include for example benzyl (meth)acrylate, phenoxyethyl (meth)acrylate; phenoxy-2-methylethyl (meth)acrylate; phenoxyethoxyethyl (meth)acrylate, 1-naphthyloxy ethyl acrylate; 2-naphthyloxy ethyl acrylate; phenoxy 2-methylethyl acrylate; phenoxyethoxyethyl acrylate; 2-phenylphenoxy ethyl acrylate; 4-phenylphenoxy ethyl acrylate; and phenyl acrylate.

The inclusion of only one diluent is preferred for ease in manufacturing. Preferred diluent monomers includes phenoxyethyl (meth)acrylate, and benzyl (meth)acrylate. Phenoxyethyl acrylate is commercially available from Sartomer under the trade designation "SR339"; from Eternal Chemical Co. Ltd. under the trade designation "Etermer 210"; and from Toagosei Co. Ltd under the trade designation "TO-1166". Benzyl acrylate is commercially available from Osaka Organic Chemical, Osaka City, Japan.

Such optional monomer(s) may be present in the polymerizable composition in amount of at least about 5 wt-%. The optional monomer(s) typically total no more than about 70 wt-% of the curable composition. The some embodiments the total amount of diluent monomer ranges from about 10 wt-% to about 50-%.

The quantum dot layer can have any useful amount of quantum dots, and in some embodiments the quantum dot layer can include from 0.1 wt % to 1 wt % quantum dots, based on the total weight of the quantum dot layer (dots and polymeric binder). The dispersion composition can also contain a surfactant (i.e., leveling agent), a polymerization initiator, and other additives, as known in the art.

The dispersion composition may also include a non-aqueous solvent. As used herein, the term "non-aqueous" means that no water is purposefully added to the compositions. However, a small amount of water might be present as an impurity in other components or might be present as a reaction by-product of a surface modification process or the polymerization process. The non-aqueous solvents are typically selected to be compatible (i.e., miscible) with the surface modifying agent added to the surface of the fluorescent semiconductor nanoparticles. Suitable non-aqueous solvents include, but are not limited to, aromatic hydrocarbons (e.g., toluene, benzene, or xylene), aliphatic hydrocarbons such as alkanes (e.g., cyclohexane, heptane, hexane, or octane), alcohols (e.g., methanol, ethanol, isopropanol, or butanol), ketones (e.g., acetone, methyl ethyl ketone, methyl isobutyl ketone, or cyclohexanone), aldehydes, amines, amides, esters (e.g., amyl acetate, ethylene carbonate, propylene carbonate, or methoxypropyl acetate), glycols (e.g., ethylene glycol, propylene glycol, butylene glycol, triethylene glycol, diethylene glycol, heylene glycol, or glycol ethers such as those commercially available from Dow Chemical, Midland, Mich. under the trade designation DOWANOL), ethers (e.g., diethyl ether), dimethyl sulfoxide, tetramethylsulfone, halocarbons (e.g., methylene chloride, chloroform, or hydrofluoroethers), or combinations thereof.

Generally, the ligand-functional quantum dots, the polymeric binder and optional solvent are combined and subject to high shear mixing to produce a dispersion of the ligand functional quantum dots in the polymer matrix. The matrix is chosen such there is limited compatibility and the quantum dots form a separate, non-aggregating phase in the matrix. The dispersion is then coated and cured either thermally, free-radically, or both to lock in the dispersed structure and exclude oxygen and water from the dispersed quantum dots.

When using a free-radicallycurable binder composition, the curable composition further comprises photoinitiators, in an amount between the range of about 0.1% and about 5% by weight.

Useful photoinitiators include those known as useful for photocuring free-radically polyfunctional (meth)acrylates. Exemplary photoinitiators include benzoin and its derivatives such as alpha-methylbenzoin; alpha-phenylbenzoin; alpha-allylbenzoin; alpha-benzylbenzoin; benzoin ethers such as benzil dimethyl ketal (e.g., "IRGACURE 651" from BASF, Florham Park, N.J.), benzoin methyl ether, benzoin ethyl ether, benzoin n-butyl ether; acetophenone and its derivatives such as 2-hydroxy-2-methyl-1-phenyl-1-propanone (e.g., "DAROCUR 1173" from BASF, Florham Park, N.J.) and 1-hydroxycyclohexyl phenyl ketone (e.g., "IRGACURE 184" from BASF, Florham Park, N.J.); 2-methyl-1-[4-(methylthio)phenyl]-2-(4-morpholinyl)-1-propanone (e.g., "IRGACURE 907" from BASF, Florham Park, N.J.); 2-benzyl-2-(dimethylamino)-1-[4-(4-morpholinyl)phenyl]-1-butanone (e.g., "IRGACURE 369" from BASF, Florham Park, N.J.) and phosphine oxide derivatives such as Ethyl-2,4,6-trimethylbenzoylphenylphoshinate (e.g. "TPO-L" from BASF, Florham Park, N.J.), and Irgacure 819 (phenylbis(2,4,6-trimethylbenzoyl)phosphine oxide) available from BASF, Florham Park, N.J.

Other useful photoinitiators include, for example, pivaloin ethyl ether, anisoin ethyl ether, anthraquinones (e.g., anthraquinone, 2-ethylanthraquinone, 1-chloroanthraquinone, 1,4-dimethylanthraquinone, 1-methoxyanthraquinone, or benzanthraquinone), halomethyltriazines, benzophenone and its derivatives, iodonium salts and sulfonium salts, titanium complexes such as bis(eta$_5$-2,4-cyclopentadien-1-yl)-bis[2,6-difluoro-3-(1H-pyrrol-1-yl) phenyl]titanium (e.g., "CGI 784DC" from BASF, Florham Park, N.J.); halomethyl-nitrobenzenes (e.g., 4-bromomethylnitrobenzene), mono- and bis-acylphosphines (e.g., "IRGACURE 1700", "IRGACURE 1800", "IRGACURE 1850", and "DAROCUR 4265").

The curable composition may be irradiated with activating UV or visible radiation to polymerize the components preferably in the wavelengths of 250 to 500 nanometers. UV light sources can be of two types: 1) relatively low light intensity sources such as blacklights that provide generally 10 mW/cm$^2$ or less (as measured in accordance with procedures approved by the United States National Institute of Standards and Technology as, for example, with a UVI-MAP™ UM 365 L-S radiometer manufactured by Electronic Instrumentation & Technology, Inc., in Sterling, Va.) over a wavelength range of 280 to 400 nanometers and 2) relatively high light intensity sources such as medium- and high-pressure mercury arc lamps, electrodeless mercury lamps, light emitting diodes, mercury-xenon lamps, lasers and the like, which provide intensities generally between 10 and 5000 mW/cm$^2$ in the wavelength rages of 320-390 nm (as measured in accordance with procedures approved by the United States National Institute of Standards and Technology as, for example, with a PowerPuck™ radiometer manufactured by Electronic Instrumentation & Technology, Inc., in Sterling, Va.).

In some embodiments, the polymeric binder is an epoxy compound that can be cured or polymerized by the processes that are those known to undergo cationic polymerization and include 1,2-, 1,3-, and 1,4-cyclic ethers (also designated as 1,2-, 1,3-, and 1,4-epoxides). Suitable epoxy binders can include, for example, those epoxy binders described in U.S. Pat. No. 6,777,460. In particular, cyclic ethers that are useful include the cycloaliphatic epoxies such as cyclohexene oxide and the ERL™ and UVR™ series type of binders available from Dow Chemical, Midland, Mich., such as vinylcyclohexene oxide, vinylcyclohexene dioxide, 3,4-epoxycyclohexylmethyl-3,4-epoxycyclohexane carboxylate, bis-(3,4-epoxycyclohexyl) adipate and 2-(3,4-epoxycylclohexyl-5,5-spiro-3,4-epoxy) cyclohexene-meta-dioxane; also included are the glycidyl ether type epoxy binders such as propylene oxide, epichlorohydrin, styrene oxide, glycidol, the EPON, EPONEX, and HELOXY series type of epoxy binders available from Resolution Performance Products, Houston, Tex., including the diglycidyl either of bisphenol A and chain extended versions of this material such as EPON 828, EPON 1001, EPON 1004, EPON 1007, EPON 1009 and EPON 2002 or their equivalent from other manufacturers, EPONEX 1510, the hydrogenated diglycidyl either of bisphenol A, HELOXY 67, diglycidyl ether of 1,4-butanediol, HELOXY™ 107, diglycidyl ether of cyclohexane dimethanol, or their equivalent from other manufacturers, dicyclopentadiene dioxide, epoxidized vegetable oils such as epoxidized linseed and soybean oils available as VIKOLOX and VIKOFLEX binders from Atofina, Philadelphia, Pa., epoxidized KRATON LIQUID POLYMERS, such as L-207 available from Kraton Polymers, Houston, Tex., epoxidized polybutadienes such as the POLY BD binders from Atofina, Philadelphia, Pa., 1,4-butanediol diglycidyl ether, polyglycidyl ether of phenolformaldehyde, and for example DEN™ epoxidized phenolic novolac binders such as DEN 431 and DEN 438 available from Dow Chemical Co., Midland Mich., epoxidized cresol novolac binders such as ARALDITE ECN 1299 available from Vantico AG, Basel, Switzerland, resorcinol diglycidyl ether, and epoxidized polystyrene/polybutadiene blends such as the Epofriendz binders such as EPOFRIEND A1010 available from Daicel USA Inc., Fort Lee, N.J., and resorcinol diglycidyl ether.

Higher molecular weight polyols include the polyethylene and polypropylene oxide polymers in the molecular weight (Mn) range of 200 to 20,000 such as the CARBOWAX polyethyleneoxide materials available from Dow Chemical Co., Midland, Mich., caprolactone polyols in the molecular weight range of 200 to 5,000 such as the TONE polyol materials available from Dow, polytetramethylene ether glycol in the molecular weight range of 200 to 4,000, such as the TERATHANE materials available from DuPont and POLYTHF 250 from BASF, polyethylene glycol, such as PEG™ 200 available from Dow, hydroxyl-terminated polybutadiene binders such as the POLY BD materials available from Atofina, Philadelphia, Pa., phenoxy binders such as those commercially available from Phenoxy Associates, Rock Hill, S.C., or equivalent materials supplied by other manufacturers.

It is also within the scope of this invention to include one or more epoxy binders which can be blended together. It is also within the scope of this invention to include one or more mono or poly-alcohols which can be blended together. The different kinds of binders and alcohols can be present in any proportion.

It is within the scope of this invention to use vinyl ether monomers as the cationically curable material. Vinyl ether-containing monomers can be methyl vinyl ether, ethyl vinyl ether, tert-butyl vinyl ether, isobutyl vinyl ether, triethyleneglycol divinyl ether (RAPT-CURE DVE-3, available from International Specialty Products, Wayne, N.J.), 1,4-cyclohexanedimethanol divinyl ether (RAPI-CURE CHVE, International Specialty Products), trimetylolpropane trivinyl ether (available from BASF Corp., Mount Olive, N.J.) and the VECTOMER divinyl ether binders from Morflex, Greensboro, N.C., such as VECTOMER 2010, VECTOMER 2020, VECTOMER 4010, and VECTOMER 4020, or their equivalent from other manufacturers. It is within the scope of this invention to use a blend of more than one vinyl ether binder.

It is also within the scope of this invention to use one or more epoxy binders blended with one or more vinyl ether binders. The different kinds of binders can be present in any proportion.

The preferred epoxy binders include the ERL and the UVR type of binders especially 3,4-epoxycyclohexylmethyl-3,4-epoxycyclohexanecarboxylate, bis-(3,4-epoxycyclohexyl) adipate and 2-(3,4-epoxycylclohexyl-5,5-spiro-3,4-epoxy) cyclohexene-meta-dioxane and the bisphenol A EPON type binders including 2,2-bis-p-(2,3-epoxypropoxy) phenylpropane and chain extended versions of this material and, binders of the type EPONEX 1510 and HELOXY 107 and 68. Also useful in the present invention are purified versions of these epoxies as described in U.S. Published Patent Application 2002/0022709 published 21 Feb. 2002.

When preparing compositions containing epoxy monomers, hydroxy-functional materials can be added. The hydroxyl-functional component can be present as a mixture or a blend of materials and can contain mono- and polyhydroxyl containing materials. Preferably, the hydroxy-functional material is at least a diol. When used, the hydroxyl-functional material can aid in chain extension and in preventing excess crosslinking of the epoxy during curing, e.g., increasing the toughness of the cured composition.

When present, useful hydroxyl-functional materials include aliphatic, cycloaliphatic or alkanol-substituted arene mono- or poly-alcohols having from about 2 to about 18 carbon atoms and two to five, preferably two to four hydroxy groups, or combinations thereof. Useful mono-alcohols can include methanol, ethanol, 1-propanol, 2-propanol, 2-methyl-2-propanol, 1-butanol, 2-butanol, 1-pentanol, neopentyl alcohol, 3-pentanol, 1-hexanol, 1-heptanol, 1-octanol, 2-phenoxyethanol, cyclopentanol, cyclohexanol, cyclohexylmethanol, 3-cyclohexyl-1-propanol, 2-norbornanemethanol and tetrahydrofurfuryl alcohol.

Polyols useful in the present invention include aliphatic, cycloaliphatic, or alkanol-substituted arene polyols, or mixtures thereof having from about 2 to about 18 carbon atoms and two to five, preferably two to four hydroxyl groups. Examples of useful polyols include 1,2-ethanediol, 1,2-propanediol, 1,3-propanediol, 1,4-butanediol, 1,3-butanediol, 2-methyl-1,3-propanediol, 2,2-dimethyl-1,3-propanediol, 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, sorbitol, diethylene glycol, triethylene glycol, tetraethylene glycol, glycerine, 2-ethyl-2-(hydroxymethyl)-1,3-propanediol, 2-ethyl-1,3-pentanediol, 1,4-cyclohexanedimethanol, 1,4-benzene-dimethanol and polyalkoxylated bisphenol A derivatives. Other examples of useful polyols are disclosed in U.S. Pat. No. 4,503,211.

Bi-functional monomers having both cationically polymerizable and free-radically polymerizable moieties in the same monomer are useful in the present invention, such as, for example, glycidyl methacrylate, or 2-hydroxyethyl acrylate.

It is also within the scope of this invention to add a free radically polymerizable monomer, such as an acrylate or methacrylate. The addition of such a monomer broadens the scope of obtainable physical properties and processing options. When two or more polymerizable monomers are present, they can be present in any proportion.

Suitable cationic photoinitiators are selected from organic onium cations, for example those described in photoinitiators for Free Radical Cationic & Anionic Photopolymerization, 2'~d Edition, J. V. Crivello & K. Dietliker, John Wiley and Sons, 1998, pp. 275 to 298, and U.S. Pat. Nos. 4,250,311, 3,708,296, 4,069,055, 4,216,288, 5,084,586 and 5,124,417 and such descriptions incorporated herein by reference, including aliphatic or aromatic Group IVA-VIIA (CAS version) centered onium salts, preferably I-, S-, P- and C-centered onium salts, such as those selected from sulfoxonium, diaryliodonium, triarylsulfonium, carbonium and phosphonium, and most preferably I-, and S-centered onium salts, such as those selected from sulfoxonium, diaryliodonium, and triarylsulfonium, wherein "aryl" means an unsubstituted or substituted aromatic moiety having up to four independently selected substituents.

In some embodiments, the polymeric binder is a thermally curable epoxy-amine composition optionally further comprising a radiation-curable acrylate as described in Applicant's copending WO 2015095296 (Eckert et al.); Thiol-epoxy resins as described in WO 2016/167927 (Qiu et al., published 20 Oct. 2016), thiol-alkene-epoxy resins as described in WO 2016/168048 (Qui et al. published 20 Oct. 2016); thiol-alkene resins as described in WO 2016/081219 (Qui et al., published 26 May 2016), and thiol silicones as described in WO 2015/138174 (Qiu et al., published 17 Sep. 2015).

Referring to FIG. 1, quantum dot article 10 includes a first barrier layer 32, a second barrier layer 34, and a quantum dot layer 20 between the first barrier layer 32 and the second barrier layer 34. The quantum dot layer 20 includes a plurality of quantum dots 22 dispersed in a matrix 24.

The barrier layers 32, 34 can be formed of any useful material that can protect the quantum dots 22 from exposure to environmental contaminates such as, for example, oxygen, water, and water vapor. Suitable barrier layers 32, 34 include, but are not limited to, films of polymers, glass and dielectric materials. In some embodiments, suitable materials for the barrier layers 32, 34 include, for example, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof.

More particularly, barrier films can be selected from a variety of constructions. Barrier films are typically selected such that they have oxygen and water transmission rates at a specified level as required by the application. In some embodiments, the barrier film has a water vapor transmission rate (WVTR) less than about 0.005 $g/m^2$/day at 38° C. and 100% relative humidity; in some embodiments, less than about 0.0005 $g/m^2$/day at 38° C. and 100% relative humidity; and in some embodiments, less than about 0.00005 $g/m^2$/day at 38° C. and 100% relative humidity. In some embodiments, the flexible barrier film has a WVTR of less than about 0.05, 0.005, 0.0005, or 0.00005 g/m²/day at 50° C. and 100% relative humidity or even less than about 0.005, 0.0005, 0.00005 g/m²/day at 85° C. and 100% relative humidity. In some embodiments, the barrier film has an oxygen transmission rate of less than about 0.005 g/m²/day at 23° C. and 90% relative humidity; in some embodiments, less than about 0.0005 g/m²/day at 23° C. and 90% relative humidity; and in some embodiments, less than about 0.00005 g/m²/day at 23° C. and 90% relative humidity.

Exemplary useful barrier films include inorganic films prepared by atomic layer deposition, thermal evaporation, sputtering, and chemical vapor deposition. Useful barrier films are typically flexible and transparent. In some embodiments, useful barrier films comprise inorganic/organic. Flexible ultra-barrier films comprising inorganic/organic multi-layers are described, for example, in U.S. Pat. No. 7,018,713 (Padiyath et al.). Such flexible ultra-barrier films may have a first polymer layer disposed on polymeric film substrate that is overcoated with two or more inorganic barrier layers separated by at least one second polymer layer. In some embodiments, the barrier film comprises one inorganic barrier layer interposed between the first polymer layer disposed on the polymeric film substrate and a second polymer layer 224.

In some embodiments, each barrier layer 32, 34 of the quantum dot article 10 includes at least two sub-layers of different materials or compositions. In some embodiments, such a multi-layered barrier construction can more effectively reduce or eliminate pinhole defect alignment in the barrier layers 32, 34, providing a more effective shield against oxygen and moisture penetration into the matrix 24. The quantum dot article 10 can include any suitable material or combination of barrier materials and any suitable number of barrier layers or sub-layers on either or both sides of the quantum dot layer 20. The materials, thickness, and number of barrier layers and sub-layers will depend on the particular application, and will suitably be chosen to maximize barrier protection and brightness of the quantum dots 22 while minimizing the thickness of the quantum dot article 10. In some embodiments each barrier layer 32, 34 is itself a laminate film, such as a dual laminate film, where each barrier film layer is sufficiently thick to eliminate wrinkling in roll-to-roll or laminate manufacturing processes. In one illustrative embodiment, the barrier layers 32, 34 are polyester films (e.g., PET) having an oxide layer on an exposed surface thereof.

The quantum dot layer 20 can include one or more populations of quantum dots or quantum dot materials 22. Exemplary quantum dots or quantum dot materials 22 emit green light and red light upon down-conversion of blue primary light from a blue LED to secondary light emitted by the quantum dots. The respective portions of red, green, and blue light can be controlled to achieve a desired white point for the white light emitted by a display device incorporating the quantum dot article 10. Exemplary quantum dots 22 for use in the quantum dot articles 10 include, but are not limited to, CdSe with ZnS shells. Suitable quantum dots for use in quantum dot articles described herein include, but are not limited to, core/shell luminescent nanocrystals including CdSe/ZnS, InP/ZnS, PbSe/PbS, CdSe/CdS, CdTe/CdS or CdTe/ZnS. In exemplary embodiments, the luminescent nanocrystals include an outer ligand coating and are dispersed in a polymeric matrix. Quantum dot and quantum dot materials 22 are commercially available from, for example, Nanosys Inc., Milpitas, Calif. The quantum dot layer 20 can have any useful amount of quantum dots 22, and in some embodiments the quantum dot layer 20 can include from 0.1 wt % to 1 wt % quantum dots, based on the total weight of the quantum dot layer 20.

In some embodiments, the quantum dot materials can include quantum dots dispersed in a liquid carrier, which may be ligand functional or non-functional. Desirably, the liquid carrier is chosen to match the transmissivity of the polymer matrix. To increase the optical path length through the quantum dot layer and improve quantum dot absorption and efficiency, the difference in the refractive indices of the carrier liquid and the polymer matrix is ≥0.05, preferably ≥0.1.

In some embodiments, the ligand system can be a liquid at the time of infiltration, and subsequently converted to a solid by curing, polymerization, or solvent removal. In some embodiments the ligand system may remain liquid to provide droplets of quantum dots dispersed in a carrier liquid, in turn dispersed in a polymer matrix.

In one or more embodiments the quantum dot layer 20 can optionally include scattering beads or particles. These scattering beads or particles have a refractive index that differs from the refractive index of the matrix material 24 by at least 0.05, or by at least 0.1. These scattering beads or particles can include, for example, polymers such as silicone, acrylic, nylon, and the like, or inorganic materials such as $TiO_2$, $SiO_x$, $AlO_x$, and the like, and combinations thereof. In some embodiments, including scattering particles in the quantum dot layer 20 can increase the optical path length through the quantum dot layer 20 and improve quantum dot absorption and efficiency. In many embodiments, the scattering beads or particles have an average particle size from 1 to 10 micrometers, or from 2 to 6 micrometers. In some embodiments, the quantum dot material 20 can optionally include fillers such fumed silica.

In some preferred embodiments, the scattering beads or particles are Tospearl™ 120A, 130A, 145A and 2000B spherical silicone resins available in 2.0, 3.0, 4.5 and 6.0 micron particle sizes respectively from Momentive Specialty Chemicals Inc., Columbus, Ohio.

The matrix 24 of the quantum dot layer 20 can be formed from an polymeric binder or binder precursor that adheres to the materials forming the barrier layers 32, 34 to form a laminate construction, and also forms a protective matrix for the quantum dots 22.

Figure 2:
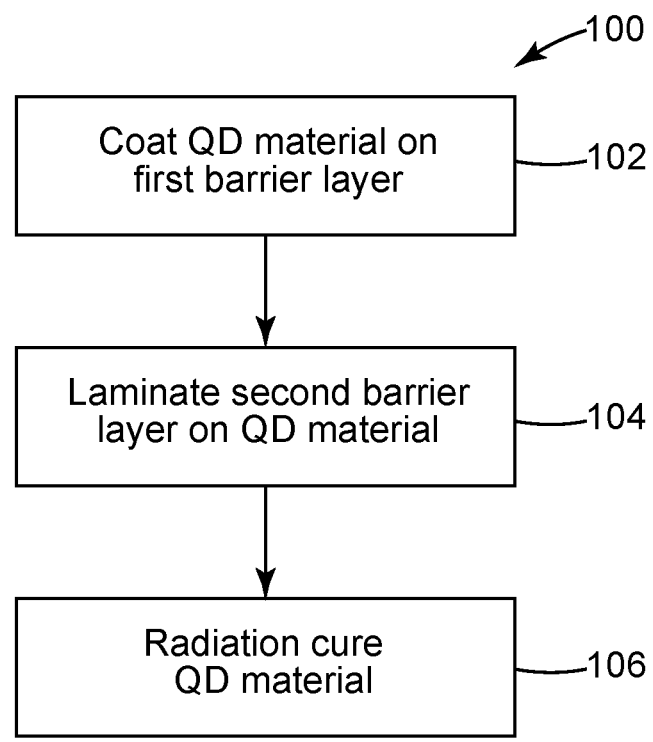
FIG. 2 is a flow diagram of an illustrative method of forming a quantum dot film.

Referring to FIG. 2, in another aspect, the present disclosure is directed to a method of forming a quantum dot film article 100 including coating an adhesive composition including quantum dots on a first barrier layer 102 and disposing a second barrier layer on the quantum dot material 104. In some embodiments, the method 100 includes polymerizing (e.g., radiation curing) the radiation curable methacrylate compound to form a partially cured quantum dot material 106 and polymerizing the binder composition to form a cured matrix 108.

In some embodiments, the binder composition can be cured or hardened by heating. In other embodiments, the adhesive composition may also be cured or hardened by applying radiation such as, for example, ultraviolet (UV) light. Curing or hardening steps may include UV curing, heating, or both. In some example embodiments that are not intended to be limiting, UV cure conditions can include applying about 10 mJ/cm² to about 4000 mJ/cm² of UVA, more preferably about 10 mJ/cm² to about 200 mJ/cm² of UVA. Heating and UV light may also be applied alone or in combination to increase the viscosity of the binder composition, which can allow easier handling on coating and processing lines.

In some embodiments, the binder composition may be cured after lamination between the overlying barrier films 32, 34. Thus, the increase in viscosity of the binder composition locks in the coating quality right after lamination. By curing right after coating or laminating, in some embodiments the cured binder increases in viscosity to a point that the binder composition acts as a pressure sensitive adhesive (PSA) to hold the laminate together during the cure and greatly reduces defects during the cure. In some embodiments, the radiation cure of the binder provides greater control over coating, curing and web handling as compared to traditional thermal curing.

Once at least partially cured, the binder composition forms polymer network that provides a protective supporting matrix 24 for the quantum dots 22.

Ingress, including edge ingress, is defined by a loss in quantum dot performance due to ingress of moisture and/or oxygen into the matrix 24. In various embodiments, the edge ingress of moisture and oxygen into the cured matrix 24 is less than about 1.25 mm after 1 week at 85° C., or about less than 0.75 mm after 1 week at 85° C., or less than about 0.5 mm after 1 week at 85° C. In various embodiments, oxygen permeation into the cured matrix is less than about 80 (cc·mil)/(m² day), or less than about 50 (cc·mil)/(m² day). In various embodiments, the water vapor transmission rate of the cured matrix should be less than about 15 (20 g/m²·mil·day), or less than about 10 (20 g/m²·mil·day).

In various embodiments, the thickness of the quantum dot layer 20 is about 80 microns to about 250 microns.

Figure 3:
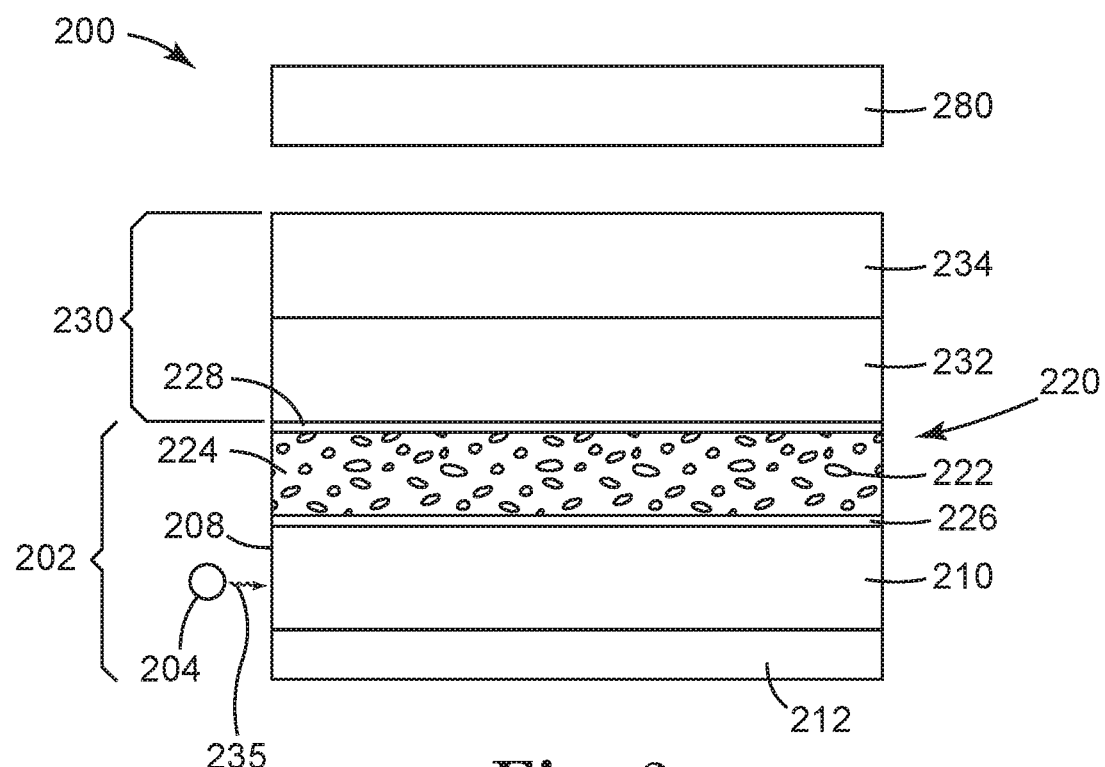
FIG. 3 is a schematic illustration of an embodiment of a display including a quantum dot article.

FIG. 3 is a schematic illustration of an embodiment of a display device 200 including the quantum dot articles described herein. This illustration is merely provided as an example and is not intended to be limiting. The display device 200 includes a backlight 202 with a light source 204 such as, for example, a light emitting diode (LED). The light source 204 emits light along an emission axis 235. The light source 204 (for example, a LED light source) emits light through an input edge 208 into a hollow light recycling cavity 210 having a back reflector 212 thereon. The back reflector 212 can be predominately specular, diffuse or a combination thereof, and is preferably highly reflective. The backlight 202 further includes a quantum dot article 220, which includes a protective matrix 224 having dispersed therein quantum dots 222. The protective matrix 224 is bounded on both surfaces by polymeric barrier films 226, 228, which may include a single layer or multiple layers.

The display device 200 further includes a front reflector 230 that includes multiple directional recycling films or layers, which are optical films with a surface structure that redirects off-axis light in a direction closer to the axis of the display, which can increase the amount of light propagating on-axis through the display device, this increasing the brightness and contrast of the image seen by a viewer. The front reflector 230 can also include other types of optical films such as polarizers. In one non-limiting example, the front reflector 230 can include one or more prismatic films 232 and/or gain diffusers. The prismatic films 232 may have prisms elongated along an axis, which may be oriented parallel or perpendicular to an emission axis 235 of the light source 204. In some embodiments, the prism axes of the prismatic films may be crossed. The front reflector 230 may further include one or more polarizing films 234, which may include multilayer optical polarizing films, diffusely reflecting polarizing films, and the like. The light emitted by the front reflector 230 enters a liquid crystal (LC) panel 280.

Numerous examples of backlighting structures and films may be found in, for example, Publication No. US 2011/0051047.

EXAMPLES

Materials

| Designation | Description | Source |
|---|---|---|
| S4 | Pentaerythritol tetra(3-mercaptopropionate), [C(CH₂OC(O)CH₂CH₂SH)₄, CAS#7575-23-7, MW = 488.66] | Bruno Bock Chemische Fabrik GmbH & Co. KG, Marschacht, Germany |
| S3 | Trimethylolpropane tris(3-mercaptopropionate), CAS#33007-83-9) | |
| PS849 | HS-functionalized silicone copolymer (Lot#21150086, 20-25% HS, 185cs) | UCT, Inc.,Bristol, PA 19007 |
| TAIC | Triallyl Isocyanurate [CAS#1025-15-6, MW = 249.27] | TCI America, Portland, Oregon |

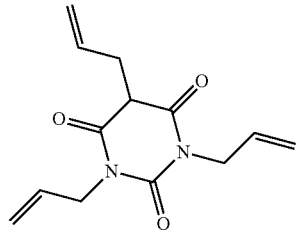 [SMILES: C=CCC1C(=O)N(CC=C)C(=O)N(CC=C)C1=O]

| TPO-L | Ethyl - 2,4,6 - trimethylbenzoylphenylphosphinate, is a liquid UV initiator, under trade designation "LUCIRIN TPO-L" | BASF America Corporation, Florham Park, New Jersey |
|---|---|---|
| QD-1 | Green CdSe quantum dots stabilized with amine-functionalized silicone (Lot# QCG101713-26, OD-35) | Nanosys, Inc., Milpitas, California |
| QD-2 | Green CdSe quantum dots stabilized with amine-functionalized silicone (Lot# QCG101713-24) | |
| QD-3 | Red_CdSe quantum dots stabilized with amine-functionalized silicone (Lot# QCG052814-21) | |
| QD-4 | Green CdSe quantum dots stabilized with amine-functionalized silicone (Lot# QCG052114-23) | |

Anhydrous solvents, hexane and toluene were obtained from Aldrich Chemical Company, Milwaukee, Wis.

Method for Measuring Quantum Yield (QY)

All quantum yields (EQE) were measured by using an absolute PL Quantum Yield Spectrometer C11347 (Hamamatsu Corporation, Middlesex, N.J.).

Preparation of Quantum Dot Solutions QD-S1, QD-S2, QD-S3 and QD-S4

QD-S1, QD-S2 and QD-S3 were prepared by mixing about 0.1 mL of QD-1, QD-2 and QD-3, respectively, with 4 mL of toluene forming clear solutions in a nitrogen glove box for quantum yields measurement. Similarly, QD-S4 was formulated by mixing 31.6 mg QD-4 in 10 mL of toluene in a nitrogen glove box for study.

Preparation of Ligand Solutions L-S1 to L-S5

L-S1 to L-S5 were prepared by mixing the corresponding ligand in a desired solvent in a nitrogen glove box as summarized in Table 1, below.

TABLE 1

| Ligand Solution | Ligand (amount, g) | Solvent (amount, mL) | Comment |
|---|---|---|---|
| L-S1 | S4 (0.027) | Hexane (4) | Haze |
| L-S2 | S4 (0.077) | Hexane (4) | Limited solubility |
| L-S3 | S3 (0.072) | Hexane (4) | Some haze |
| L-S4 | S4 (5.010) | Toluene (100) | Clear solution |
| L-S5 | S4 (9.750) | Toluene (100) | Clear solution |
| L-S6 | PS849 (0.0861) | Toluene (10) | Clear solution |

Examples 1 to 3 (EX-1 to EX-3) and Comparative Example A and B (CE-A and CE-B)

To prepare EX-1 to EX-3, in nitrogen box, selected quantum dot solutions and polythiol ligand solutions, prepared as described above, were mixed in a 4 mL cuvette, sealed and gently shook for 1 minute to ensure complete mixing, then measured quantum yield at time intervals varying from 0 minutes to 24 hours.

CE-A and CE-B were prepared in the same manner as EX-1 to EX-3, except that the quantum dot solutions were mixed with pure hexane (without polythiol ligands).

The formulations and the results of quantum yield measurements for EX-1 to EX-3 and CE-A and CE-B are summarized in Table 2, below.

TABLE 2

| Example | Formulation | | Time | QY, % | Abs, % |
|---|---|---|---|---|---|
| EX-1 | 4 mL L-S1 | 0.1 mL QD-S1 | Initial | 79.4 | 18.8 |
| | | | 15 min | 81.1 | 18.8 |
| | | | 30 min | 85.4 | 17.7 |
| | | | 45 min | 84.0 | 17.5 |
| | | | 60 min | 84.3 | 19.2 |
| | | | 24 hors | 89.4 | 17.5 |
| EX-2 | 4 mL L-S2 | 0.1 mL QD-S1 | Initial | 87.8 | 16.6 |
| | | | 15 min | 98.1 | 14.3 |
| | | | 30 min | 99.8 | 14.4 |
| | | | 45 min | 98.5 | 14.5 |
| | | | 60 min | 99.5 | 14.3 |
| | | | 24 hors | 99.0 | 13.7 |
| CE-A | 4 mL Hexane | 0.1 mL QD-S1 | Initial | 71.4 | 17.1 |
| | | | 24 hrs | 73.8 | 16.7 |
| EX-3 | 4 mL L-S3 | 0.1 mL QD-S2 | Initial | 92.5 | 17.2 |
| | | | 15 min | 93.7 | 16.8 |
| | | | 30 min | 96.2 | 16.4 |
| | | | 24 hrs | 95.2 | 17.5 |
| CE-B | 4 mL Hexane | 0.1 mL QD-S2 | Initial | 71.4 | 16.1 |
| | | | 24 hrs | 72.8 | 16.9 |

Examples 4 to 11 (EX-4 to EX-11) and Comparative Examples C and D (CE-C and CE-D)

EX-4 to EX-11 were prepared in the same manner as EX-1 to EX-3, using selected quantum dot solutions at different concentrations (or different optical density, OD) and same amount of polythiol ligand solutions prepared as described above and then quantum yields at time intervals varying from 0 minutes to 24 hours were measured.

CE-C and CE-D were prepared in the same manner as CE-A and CE-D, except that the selected quantum dot solutions were mixed with pure toluene (without polythiol ligands).

The formulations and the results of quantum yield measurements for EX-4 to EX-11 and CE-C and CE-D are summarized in Table 3, below.

TABLE 3

| Example | Formulation | | OD | Time | QY, % | Abs, % |
|---|---|---|---|---|---|---|
| EX-4 | 4 mL L-S4 | 0.05 mL QD-S1 | 0.011 | Initial | 75.3 | 15.7 |
| | | | | 24 hrs | 71.4 | 16.8 |
| EX-5 | 4 mL L-S4 | 0.10 mL QD-S1 | 0.022 | Initial | 90 | 24.3 |
| | | | | 30 min | 89 | 24.8 |
| | | | | 24 hrs | 90.2 | 24.6 |
| EX-6 | 4 mL L-S4 | 0.15 mL QD-S1 | 0.032 | Initial | 90.4 | 34.2 |
| | | | | 30 min | 90.6 | 34.1 |
| | | | | 24 hrs | 89.5 | 35.3 |
| CE-C | 4 mL Toluene | 0.20 mL QD-S1 | 0.044 | Initial | 75.7 | 35.5 |
| | | | | 24 hrs | 75.5 | 35.6 |
| EX-7 | 4 mL L-S4 | 0.05 mL QD-S2 | 0.01 | Initial | 89.4 | 16.1 |
| | | | | 24 hrs | 95.3 | 18.2 |
| EX-8 | 4 mL L-S4 | 0.10 mL QD-S2 | 0.022 | Initial | 97.6 | 27.5 |
| | | | | 24 hrs | 99.1 | 26.9 |
| EX-9 | 4 mL L-S4 | 0.15 mL QD-S2 | 0.032 | Initial | 93.0 | 37.4 |
| | | | | 24 hrs | 91.7 | 38.8 |
| EX-10 | 4 mL L-S4 | 0.20 mL QD-S2 | 0.042 | Initial | 94.1 | 43.2 |
| | | | | 24 hrs | 92.9 | 43.8 |
| EX-11 | 4 mL L-S4 | 0.30 mL QD-S2 | 0.061 | Initial | 95.5 | 53.7 |
| | | | | 24 hrs | 95.4 | 52.8 |
| CE-D | 4 mL Toluene | 0.15 mL QD-S2 | 0.032 | Initial | 85.4 | 37.9 |
| | | | | 24 hrs | 87.0 | 37.3 |

Examples 12- to 16 (EX-12 to EX-16) and Comparative Example E (CE-E)

EX-12 to EX-16 were prepared in the same manner as EX-1 to EX-3, using selected quantum dot solutions and polythiol ligand solutions prepared as described above and then quantum yields at time intervals varying from 0 minutes to 24 hours were measured.

CE-E was prepared in the same manner as CE-D, except that the selected quantum dot solution was mixed with pure toluene (without polythiol ligands).

The formulations and the results of quantum yield measurements for EX-12 to EX-16 and CE-E are summarized in Table 4, below.

TABLE 4

| Example | Formulation | | Time | QY % | Abs % |
|---|---|---|---|---|---|
| EX-12 | 3 mL L-S5 + 1 mL Toluene | 0.05 mL QD-S3 | Initial | 77.5 | 7.1 |
| | | | 24 hrs | 78.6 | 6.7 |
| EX-13 | 3 mL L-S5 + 1 mL Toluene | 0.10 mL QD-S3 | Initial | 85.6 | 12.2 |
| | | | 24 hrs | 88.7 | 11.7 |
| EX-14 | 3 mL L-S5 + 1 mL Toluene | 0.15 mL QD-S3 | Initial | 78.5 | 18.7 |
| | | | 24 hrs | 84.3 | 16.9 |
| EX-15 | 3 mL L-S5 + 1 mL Toluene | 0.20 mL QD-S3 | Initial | 80.8 | 23.0 |
| | | | 24 hrs | 77.1 | 23.1 |
| EX-16 | 3 mL L-S5 + 1 mL Toluene | 0.30 mL QD-S3 | Initial | 77.7 | 31.8 |
| | | | 24 hrs | 75.8 | 31.4 |
| CE-E | 4 mL Toluene | 0.20 mL QD-S3 | Initial | 51.2 | 22.7 |
| | | | 24 hrs | 51.2 | 23.8 |

Examples 17 to 21 (EX-17 to EX-21)

EX-17 to EX-21 were prepared by mixing polythiol S4 with QD-1 along with varying amounts of toluene in a nitrogen glove box to determine their compatibility. The formulations and the results of quantum yield measurements for EX-17 to EX-21 are summarized in Table 5, below.

TABLE 5

| Example | Formulation S4 | QD-1 | Toluene | Time | Appearance | QY, % | Abs, % |
|---|---|---|---|---|---|---|---|
| EX-17 | 1 mL S4 (1.2816 g) | 0.0759 g | None | | not homogeneous | N/A | N/A |
| EX-18 | | | 1 mL | | Haze solution | N/A | N/A |
| EX-19 | | | 3 mL | | Clear solution | N/A | N/A |
| EX-20 | 1 mL S4 (1.2816 g) | 0.0759 g | 4 mL | Initial | Clear solution | 92.5 | 89.8 |
| | | | | 24 hrs | Clear solution | 92.4 | 89.1 |
| EX-21 | 1 mL EX-20 | | 3 mL | Initial | Clear solution | 92.2 | 60.3 |
| | | | | 24 hrs | Clear solution | 92.2 | 60.2 |

* N/A, not measured

Note that without adding sufficient amounts of solvent (toluene), a hazy or nonhomogeneous mixture was observed from above formulations, indicating poor compatibility of polythiol with amino-silicone stabilized quantum dots. Addition of sufficient toluene solvent led to clear solutions, which, without wishing to be bound by theory, was thought to be helpful for polythiol bonding on quantum dots. From the clear solutions at high concentration (i.e., EX-20) with absorption at ~89%, high quantum yield was achieved, even after 24 hours. Similar quantum yield was obtained from further diluted solution (i.e., EX-21) at absorption of ~60%. Without wishing to be bound by theory, these results are thought to indicate that the formulation with polythiol ligands were highly stable.

Examples 22 to 23 (EX-22 to EX-23) and Comparative Example F (CE-F)

EX-22 to EX-23 were formulated with selected quantum dot solution, QD-S4, and silicone polythiol ligand solutions (L-S6) in different amounts as described above and then quantum yields at time intervals varying from 0 minutes to 24 hours were measured.

CE-F was prepared with same quantum dot solution (QD-S4) in the same manner as described in CE-A, except that the selected quantum dot solution were mixed with pure toluene (without silicone polythiol ligand).

The formulations and the results of quantum yield measurements for EX-22 to EX-23 and CE-F are summarized in Table 6, below.

TABLE 6

| Example | Formulation | | | Time | QY % | Abs % |
|---|---|---|---|---|---|---|
| CE-F | 2 mL QD-S4 | 0 mL L-S6 | 2 mL Toluene | Initial | 54 | 43.3 |
| | | | | 1 hr | 56 | 41.9 |
| | | | | 24 hrs | 57 | 40.3 |
| EX-22 | 2 mL QD-S4 | 1 mL L-S6 | 1 mL Toluene | Initial | 70 | 43 |
| | | | | 1 hr | 73 | 42.7 |
| | | | | 24 hrs | 78 | 43.6 |
| EX-23 | 2 mL QD-S4 | 2 mL L-S6 | 0 mL Toluene | Initial | 73 | 41.6 |
| | | | | 1 hr | 75 | 40.4 |
| | | | | 24 hrs | 83 | 39.6 |

Example 24 (EX-24)

In nitrogen box, 11.9 g S4 and 1 g QD-1 were fully pre-mixed in a bottle with a Cowels blade mixer at a speed of 1400 rpm for 2 minutes. Then, 8.1 g of TAIC and 0.2 g TPO-L were added and the mixture was further mixed with a Cowels blade mixer at a speed of 1400 rpm for another 2 minutes.

Then, the above prepared formulation was knife-coated between two 2-mils (50 μm) thick primed PET barrier films (FTB3-M-50, available from 3M Company, St. Paul, Minnesota under trade designation "3M FTB3 BARRIER FILM") at a thickness of about 100 μm and cured by exposing the coated film under 385 nm LED UV light for 30 seconds. The so produced films were used for quantum yield measurements as described above both on as prepared (i.e., initial QY) and after aging in 85° C. oven for 7 days.

Initial quantum yield measurement showed at 90%, compatible to the solution quantum yield with combined amino-silicone and polythiol ligand and significantly higher than that of only amino-silicone stabilized quantum dots. After aging in 85° C. oven for 7 days, the quantum yield was 87% and the edge ingress was <0.25 mm, indicating great aging stability.

What is claimed is:

1. A liquid composite comprising a fluorescent core/shell semiconductor nanoparticle, a first polyamine ligand, and second polythiol ligand, wherein at least one of said first and second ligand is a silicone ligand.

2. The liquid composite of claim 1 wherein the first ligand and the second ligand is at least 50% by weight of the liquid composite.

3. The liquid composite of claim 1 wherein the fluorescent core/shell semiconductor nanoparticle is a CdS or CdSe core nanoparticle.

4. The liquid composite of claim 1 comprising an amino-silicone and a mercaptosilicone.

5. The liquid composite of claim 1 wherein the shell comprises a magnesium or zinc-containing compound.

6. The liquid composite of claim 1 wherein the shell is a multilayered shell.

7. The liquid composite of claim 6 wherein the multilayered shell comprises an inner shell overcoating the core, wherein the inner shell comprises zinc selenide and zinc sulfide.

8. The liquid composite of claim 7 wherein the multilayered shell comprises an outer shell overcoating the inner shell, wherein the outer shell comprises zinc sulfide or MgS.

9. The liquid composite of claim 1 wherein the polythiol is of the formula:

$$R^2(SH)_y \qquad \mathrm{I}$$

where $R^2$ is silicone or a (hetero)hydrocarbyl group having a valence of y, and y is ≥2, preferably >2.

10. The liquid composite of claim 1 wherein the polythiols are obtained by esterification of a polyol with a terminally thiol-substituted carboxylic acid or derivative thereof.

11. The liquid composite of claim 1 wherein the polyamine is an aminosilicone is of the formula:

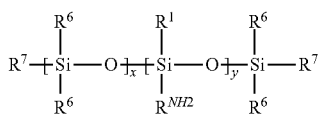  VII wherein
each of $R^1$ and $R^6$ is independently an alkyl or aryl;
$R^2$ is an amine-substituted (hetero)hydrocarbyl group;
x is 1 to 2000; preferably 3 to 100;
y may be zero;
x+y is at least one;
$R^7$ is alkyl, aryl or $R^{NH2}$
wherein amine-functional silicone has at least two $R^{NH2}$ groups.

12. The liquid composite of claim 1 further comprising one or more auxiliary ligands of the formula:

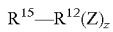  VIII wherein
$R^{15}$ is (hetero)hydrocarbyl group having $C_2$ to $C_{30}$ carbon atoms;
$R^{12}$ is a hydrocarbyl group including alkylene, arylene, alkarylene and aralkylene;
subscript z is at least one; and
Z is a ligand group, including $-CO_2H$, $-SO_3H$, $-P(O)(OH)_2$, $-OP(O)(OH)$, $-OH$ and $-NH_2$.

13. A composition comprising the liquid composite of claim 1 further comprising a curable liquid binder composition.

14. The composition of claim 13 comprising red and green fluorescent core/shell semiconductor nanoparticles.

15. The composition of claim 13 wherein the curable liquid binder composition comprises a polythiol and a polyene, and optionally a thiol-ene curing initiator.

16. The composition of claim 13 wherein the cured polymeric binder comprises polysiloxanes, fluoroelastomers, fluoroplastics, polyamides, polyimides, polycaprolactones, polycaprolactams, polyurethanes, polyvinyl alcohols, polyvinyl chlorides, polyvinyl acetates, polyesters, polycarbonates, polyacrylates, polymethacrylates, polythioethers, polyacrylamides, polyethers, polyurethanes, polythiourethanes, polyurea, polymethacrylamides and the combinations thereof.

17. An article comprising the liquid composite of claim 1 dispersed in a cured polymeric binder.

18. The article of claim 17 wherein the cured polymeric binder comprises polysiloxanes, fluoroelastomers, fluoroplastics, polyamides, polyimides, polycaprolactones, polycaprolactams, polyurethanes, poly(vinyl alcohols), poly(vinyl chlorides), poly(vinyl acetates), polyesters, polycarbonates, polyacrylates, polymethacrylates, polythioethers, polyacrylamides, polyethers, polyurethanes, polythiourethanes, polyurea, polymethacrylamides and the combinations thereof.

19. A quantum dot film article comprising:
a first barrier layer;
a second barrier layer; and
a quantum dot layer between the first barrier layer and the second barrier layer, the quantum dot layer comprising the liquid composite of claim 1, the composite particles dispersed in a cured polymeric binder.

* * * * *